US012669758B2

(12) United States Patent
Eva

(10) Patent No.: US 12,669,758 B2
(45) Date of Patent: Jun. 30, 2026

(54) OPTICAL ELEMENT WITH COOLING CHANNELS, AND OPTICAL ARRANGEMENT

(71) Applicant: Carl Zeiss SMT GmbH, Oberkochen (DE)

(72) Inventor: Eric Eva, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 121 days.

(21) Appl. No.: 18/602,629

(22) Filed: Mar. 12, 2024

(65) Prior Publication Data

US 2024/0219849 A1 Jul. 4, 2024

Related U.S. Application Data

(63) Continuation of application No. PCT/EP2022/072843, filed on Aug. 16, 2022.

(30) Foreign Application Priority Data

Sep. 13, 2021 (DE) ..................... 10 2021 210 093.7

(51) Int. Cl.
*G03F 7/00* (2006.01)

(52) U.S. Cl.
CPC ...... *G03F 7/70891* (2013.01); *G03F 7/70316* (2013.01)

(58) Field of Classification Search
CPC ............. G03F 7/70891; G03F 7/70316; G03F 7/70983; G03F 7/70033; G03F 7/7015;
(Continued)

(56) References Cited

U.S. PATENT DOCUMENTS

| | | | |
|---|---|---|---|
| 9,382,151 B2 | 7/2016 | Angell, IV et al. | |
| 10,732,519 B2 | 8/2020 | Becker et al. | |

(Continued)

FOREIGN PATENT DOCUMENTS

| | | |
|---|---|---|
| DE | 102013219808 A1 | 4/2015 |
| DE | 102019205265 A1 | 10/2020 |

(Continued)

OTHER PUBLICATIONS

German Office Action with English translation, Application No. 10 2021 210 093.7, Mar. 24, 2022, 8 pages.
(Continued)

*Primary Examiner* — Christina A Riddle
(74) *Attorney, Agent, or Firm* — Edell, Shapiro & Finnan, LLC

(57) ABSTRACT

An optical element (M2) for reflecting radiation includes: a substrate (31) formed from quartz glass or from a glass ceramic and having a first part-body (26a) and a second part-body (26b) that are joined along a bonding face (27) by hot bonding, a plurality of cooling channels (25) that run within the substrate (31) in the region of the bonding face (27) and are separated from one another by lands (35), and a reflective coating (33) applied to a surface (32) of the first part-body. In the substrate, a respective cooling channel (25) has a channel wall (36) which, at at least one position ($P_S$) adjoining a respective land (35), has a zero crossing temperature ($T_{ZC,S}$) that deviates by less than 3.0 K from a zero crossing temperature ($T_{ZC,M}$) at a middle (M) of the land. Also disclosed is an associated optical arrangement e.g. for an EUV lithography system.

21 Claims, 5 Drawing Sheets

(58) Field of Classification Search

CPC ............. G03F 7/70166; G03F 7/70158; G03F 7/70175; G03F 7/70183; G03F 7/70191; G03F 7/702; G03F 7/708; G03F 7/70808; G03F 7/70841; G03F 7/70833; G03F 7/70825; G03F 7/70858; G03F 7/70866; G03F 7/70875; G03F 7/70883; G03F 7/7095; G03F 7/70958; G03F 7/70966; G03F 7/70975; G03F 7/70991; G03F 7/70483; G03F 7/70491; G03F 7/705; G03F 7/70508; G03F 7/70516; G03F 7/70525; G03F 7/70533; G03F 7/70541; G03F 7/70504; G03F 7/7055; G03F 7/70558; G03F 7/70566; G03F 7/70575; G03F 7/70583; G02B 7/008; G02B 7/182; G02B 5/0891; G02B 17/0663; G02B 5/085; G02B 5/10; G02B 7/1815; C03C 2201/42; C03C 3/06; C03C 14/004; C03C 15/00; C03C 17/22; C03C 2201/23; C03C 2203/10; C03C 2203/40; C03C 2214/04; C03C 2214/20; C03C 3/062; C03C 3/076; C03B 19/1415; C03B 2201/42; C03B 19/1453; C03B 2201/12; C03B 2201/23; C03B 32/00; C03B 19/09; C03B 19/1407; C03B 2207/50; B23K 2103/54; B23K 26/0624; B23K 26/082; B23K 26/362; B23K 26/55

USPC ........................ 355/18, 27, 30, 52–55, 66–77

See application file for complete search history.

(56) References Cited

U.S. PATENT DOCUMENTS

| | | | |
|---|---|---|---|
| 11,874,525 B2 | 1/2024 | Eva | |
| 2007/0266733 A1* | 11/2007 | Eva | C03B 23/0026 |
| | | | 65/61 |
| 2008/0274869 A1* | 11/2008 | Englisch | C03C 3/06 |
| | | | 430/4 |
| 2009/0122428 A1* | 5/2009 | Phillips | G02B 7/181 |
| | | | 359/846 |
| 2015/0080206 A1* | 3/2015 | Duran | C03B 25/02 |
| | | | 65/117 |
| 2016/0320715 A1 | 11/2016 | Becker et al. | |
| 2022/0299731 A1* | 9/2022 | Eva | G03F 7/70891 |

FOREIGN PATENT DOCUMENTS

| | | |
|---|---|---|
| EP | 3044174 B1 | 9/2017 |
| EP | 3110766 B1 | 7/2019 |
| WO | 2015038733 A1 | 3/2015 |
| WO | 2020207741 A1 | 10/2020 |
| WO | 2021115643 A1 | 6/2021 |

OTHER PUBLICATIONS

International Preliminary Report on Patentability, PCT/EP2022/072843, Mar. 5, 2024, 9 pages.

Doremus, "Glass Science", Second Edition, Chapter 12, (1994), 4 pages.

Corning HPFS 7979, 7980, 8655 Fused Silica, Optical Materials Product Information, Jul. 2015, 8 pages.

Moulson et al., "Water in Silica Glass", Transactions of the Faraday Society, Published on Jan. 1, 1961, 9 pages.

Brueckner, "Properties and Structure of Vitreous Silica, II", Journal of Non-Crystalline Solids 5 (1971), pp. 177-216.

Brueckner, Properties and Structure of Vitreous Silica, I, Journal of Non-Crystalline Solids 5, (1970), pp. 123-175.

Brueckner et al., "The influence of t he hydroxyl content on the density and diffusion mechanism in silica glass", Glass Technical Reports, Received Oct. 10, 1964, Published 1965, 6 pages.

Brueckner et al., "The structure-modifying influence of the hydroxyl content in silica glasses", Glass Technical Reports, Received Nov. 4, 1969, Published 1970, 7 pages.

International Search Report, PCT/EP2022/072843, Jan. 30, 2023, 7 pages.

* cited by examiner

OPTICAL ELEMENT WITH COOLING CHANNELS, AND OPTICAL ARRANGEMENT

CROSS-REFERENCE TO RELATED APPLICATION

This is a Continuation of International Application PCT/EP2022/072843, which has an international filing date of Aug. 16, 2022, and the disclosure of which is incorporated in its entirety into the present Continuation by reference. This Continuation also claims foreign priority under 35 U.S.C. § 119 (a)-(d) to and also incorporates by reference, in its entirety, German Patent Application DE 10 2021 210 093.7 filed on Sep. 13, 2021.

FIELD OF THE INVENTION

The invention relates to an optical element for reflecting radiation, in particular for reflecting extreme ultraviolet (EUV) radiation, comprising: a substrate formed from quartz glass, in particular from titanium-doped quartz glass, or from a glass ceramic, and comprising a first part-body and a second part-body that are joined along a bonding face by hot bonding, a plurality of cooling channels that run, i.e., extend, within the substrate in the region of the bonding face and are separated from one another by lands, and a reflective coating applied to a surface of the first part-body. The invention also relates to an optical arrangement, in particular an EUV lithography system, comprising at least one such reflective optical element.

BACKGROUND

In an EUV lithography system in the form of an EUV lithography apparatus, reflective optical elements in the form of mirrors, in particular in the form of mirrors of a projection system, are subject to high radiant power, which leads to heating of the mirrors and hence the mirror substrate. The heating of the substrate leads to deformations at the surface of the substrate at which a reflective coating is applied (i.e. at the mirror surface). The deformations lead to image defects that impair the imaging quality of the projection system. In order to counter this problem, substrates used for the EUV mirrors are typically made of materials having a low coefficient of thermal expansion. Titanium-doped quartz glass, sold for example under the ULE® tradename by Corning, and also certain glass ceramics, e.g. Zerodur®, have a particularly low coefficient of thermal expansion and are therefore suitable for the production of substrates for EUV mirrors.

A known way of reducing the temperature of the mirrors is to introduce cooling channels into the substrate, through which a cooling fluid flows. The production of the cooling channels typically requires the introduction of passage channels having a geometry dependent on the respective mirror into the substrate. In the processing of the substrate for production of the cooling channels, stresses may occur in the glass material, which can likewise have an unfavorable effect on the shape of the mirror surface, since these can lead to unexpected changes in shape in the final forming of the mirror, for example in the milling or polishing of the mirror surface.

WO2020/207741 A1 describes a method of producing a glass body having a plurality of cooling channels. The method comprises the following steps: providing a first part-body and a second part-body of the glass body, forming at least one cooling channel by working, especially mechanically working, the glass material at a surface of the first part-body and/or of the second part-body, and producing the glass body by joining the first part-body to the second part-body at the worked surface by high-temperature bonding.

In the high-temperature bonding or hot bonding described in WO2020/207741 A1, the two part-bodies are joined along a bonding face and generally heated to a temperature of at least about 1000° C. or higher. The two part-bodies are bonded here along the bonding face without the use of a joining agent. In the case of heating to lower temperatures, it is generally the case that the requisite bond strength of the part-bodies or adherends is not achieved. In the case of bonding by high-temperature bonding, the two part-bodies may first be contact-bonded to one another along the later bonding face, before being heated to the temperatures required for the high-temperature bonding. Alternatively, the two part-bodies may be heated separately, and they are brought into contact with one another only at high temperatures along the bonding face.

It is known, for example, from the article "Properties and Structure of Vitreous Silica. II" by R. Brückner, Journal of Non-Crystalline Solids 5 (1971) 177-216 ("Brückner II" hereinafter) that, in the case of a high-temperature treatment of a quartz glass body at temperatures of about 700° C. and above, OH groups diffuse out of the quartz glass body. This results in a reduction in the OH content of the quartz glass in a depletion zone that starts from the outer surfaces of the quartz glass body and extends into a near-surface volume region. The near-surface volume region that forms the depletion zone, in a long-lasting thermal treatment, can extend several millimeters or even centimeters into the volume of the quartz glass body, and one effect is an increase in the refractive index in the near-surface volume region relative to a volume region closer to the center of the quartz glass body.

It is likewise known that a relatively low OH content in quartz glass generally leads to a relatively high viscosity at a given temperature. As a result, the annealing of the glass matrix in a quartz glass with a low OH content in customary tempering programs is not as good, and accordingly the fictive temperature cannot be set at as low a level as is possible in the case of OH-richer quartz glass. For example, it is known from the company brochure "https://www.corning.com/media/worldwide/csm/documents/HPFS_Product-_Brochure_All_Gra des_2015_07_21.pdf" that dry quartz glasses with glass code 7979 or 8655 having an OH content of less than 1 ppm have a refractive index which is about 65 ppm higher at a wavelength of 194 nm compared to glasses having a higher OH content, which is a result of the higher fictive temperature and lower OH content.

This is correspondingly applicable in the case of titanium-doped quartz glass, and the result is that, with a comparable titanium content and comparable tempering program, the zero crossing temperature of the quartz glass material and the slope of the coefficient of thermal expansion as a function of temperature remain at a higher level in the case of an OH-lower quartz glass compared to an OH-richer quartz glass. Moreover, there exists a direct dependence between the OH content of the (titanium-doped) quartz glass on the coefficient of thermal expansion and on the zero crossing temperature, and the direct dependence is typically predominant.

The effect of the OH content on the properties of quartz glass was examined, inter alia, in the article "Der struktur-modifizierende Einfluss des Hydroxylgehaltes in Kieselgläsern" [The Structure Modifying Effect of Hydroxyl Content in Silica Glasses] by Rolf Brückner, Glastechn. Berichte, page 8ff., 1970, and in the article "Der Einfluss des Hydroxylgehaltes auf die Dichte und auf den Diffusions-mechanismus in Kieselgläsern" [The Effect of Hydroxyl Content on Density and on the Mechanism of Diffusion in Silica Glasses] by Rolf Brückner, Glastechn. Berichte, page193ff., April 1965. Diffusion constants for the diffusion of OH groups in quartz glass inter alia are reported in the article "Properties and Structure of Vitreous Silica. I" by R. Brückner, Journal of Non-Crystalline Solids 5 (1970) 123-175 ("Brückner I" hereinafter) and in the article "Brückner II".

U.S. Pat. No. 10,732,519 B2 describes a substrate for an EUV mirror that has a zero crossing temperature profile that deviates from a statistical distribution. The profile of the zero crossing temperature is matched to an operating temperature of the mirror The substrate material is titanium-doped quartz glass that has been produced in a soot process. The zero crossing temperature profile and the OH content profile are mutually dependent and corresponding. In one working example, lowering of the OH content from 200 ppm by weight to 170 ppm by weight leads to a change in the zero crossing temperature, which is in the order of magnitude of about 1 K. The fictive temperature likewise depends on the OH content and, in the case of a quartz glass having an OH content of 180 ppm by volume in the bulk of the quartz glass, is about 970° C. in a tempering process with a cooling rate of 4 K/h.

EP 3 044 174 B1 discloses a method of annealing or tempering a silicon dioxide-titanium dioxide glass. The tempering method is intended to enable independent adjustment of the zero crossing temperature and the slope of the temperature-dependent curve of the coefficient of thermal expansion. EP 3 044 174 B1 states that, for a quartz glass having an OH content of about 850 ppm by weight in the bulk of the quartz glass and a cooling rate in the tempering process of about 3 K/h, the fictive temperature is lower than about 950° C.

EP 3 110 766 B1 describes a method of forming a zero crossing temperature gradient in a silicon dioxide-titanium dioxide glass article in which a thermal gradient is formed by the glass article and the glass article is cooled at a predetermined cooling rate in order to form the zero crossing temperature gradient through the thickness of the glass article.

As described above, in a high-temperature treatment or in a tempering process, the OH content in depletion zones that form at the edge of a (titanium-doped) quartz glass body is less than in the bulk, in which a (maximum) OH content in the order of magnitude of typically about 850 ppm by weight occurs in a directly deposited glass (cf. EP 3 044 174 B1) or a (maximum) OH content in the order of magnitude of about 180 ppm by weight in a glass produced by a soot process (cf. U.S. Pat. No. 10,732,519). The thickness of the depletion zone at the edge of the quartz glass can be described, for example, by that distance from the edge or from the outer surface at which the OH content has dropped to a particular percentage, for example 50%, of the maximum OH content or at which the OH content deviates by a specific absolute value from the maximum OH content. The thickness of the depletion zone depends upon factors including the hold temperature, the hold time and the heating and cooling ramps in the tempering process, and on the composition of the atmosphere of the tempering furnace and of the work-piece, and may, as described above, be a few tens of micrometers to a few millimeters.

If the substrate material contains hydrogen, as is generally the case in direct deposition and also in a homogenization process in a hydrogen/oxygen gas flame, hydrogen depletion will additionally occur in the depletion zone, and progresses more quickly than that of OH groups. If the tempering process is conducted in a reducing atmosphere, this may additionally lead to a loss of oxygen, which is manifested in the formation of oxygen-deficient centers ($\equiv$Si or Si—Ti bonds) or the reduction of $Ti^{4+}$ to $Ti^{3+}$. In addition, sodium from processing agents can diffuse into the quartz glass, which can affect the coefficient of thermal expansion.

SUMMARY

It is an object of the invention to reduce image defects in the operation of the optical element that are attributable to a gradient in the OH content caused by the hot bonding.

This and other objects are addressed by an optical element of the type specified above, in which a respective cooling channel has a channel wall which, at at least one position adjoining a respective land, in particular over an entire lateral wall section that adjoins the respective land, has a zero crossing temperature that deviates by less than 3.0 K, preferably by less than 2.0 K, in particular by less than 1.0 K, from a zero crossing temperature at a middle of the land.

The comparison between the zero crossing temperature at the position on the channel wall adjoining the respective land and the zero crossing temperature at the middle of the land is made in lateral direction, i.e. in a plane running at right angles to the thickness direction of the substrate. It will be apparent that a lateral channel wall section adjoining the land will typically have a zero crossing temperature that deviates by less than the value specified above from the zero crossing temperature at the middle of the land not just at a single position adjoining a respective land. In particular, the above-specified condition may be satisfied along the entire lateral wall section, i.e. at all positions on the lateral wall section. For the reduction of image defects, however, it may be sufficient when the above condition is satisfied only along a portion of the lateral wall section. In particular, it is not absolutely necessary for the above condition on the zero crossing temperature to be satisfied at corner regions where the lateral wall section adjoins an upper and lower wall section of the channel wall.

In one embodiment, the channel wall at at least one position facing the surface to which the reflective coating is applied, in particular over an entire upper wall section facing the surface, has a zero crossing temperature that deviates by less than 3.0 K, preferably by less than 2.0 K, in particular by less than 1.0 K, from a zero crossing temperature at the surface.

Since the thickness of the first part-body typically varies between the upper wall section of the cooling channel and the surface in lateral direction, the comparison between the zero crossing temperature at the respective position on the upper wall section of the channel wall and the zero crossing temperature at the surface is made at one and the same lateral position.

It will be apparent that the upper channel wall section will typically have a zero crossing temperature that deviates by less than the value specified above from the zero crossing temperature at the surface to which the reflective coating is applied not just at a single position. In particular, the above-specified condition may be satisfied along the entire upper wall section, i.e. at all positions on the upper wall section. For the reduction of image defects, it may be sufficient when the above condition is satisfied only along a portion of the upper wall section. In particular, it is not absolutely necessary for the above condition on the zero crossing temperature to be satisfied at corner regions where the upper wall section adjoins a respective lateral wall section of the channel wall.

As described above, the hot bonding leads to OH depletion of the glass material of the substrate in the vicinity of all the outer surfaces of the glass body joined in the hot bonding operation and hence also at the channel wall of a respective cooling channel. The inventor has recognized that the concentration gradient in the vicinity of the channel wall which is created in the outward diffusion of the OH groups affects the zero crossing temperature of the coefficient of thermal expansion of the substrate to such an extent that the mirror surface becomes deformed and image defects occur in operation of the optical element.

Whether the substrate develops a higher or lower zero crossing temperature than the undisturbed glass within the glass body because of the OH concentration gradient can possibly be influenced by the tempering program. Because of the concentration gradient, it is virtually impossible to choose a temperature program with which the same behavior of the coefficient of thermal expansion and the zero crossing temperature is established for the undisturbed glass and all OH concentrations that occur.

Another effect of the OH deficiency is that, with the same tempering program, a higher fictive temperature and hence a greater slope in the coefficient of thermal expansion as a function of temperature develops at or in the vicinity of the channel wall. In the case of heating of the mirror by a local heat load in the region of the mirror, the extent to which the expansion of OH-low regions differs from the surrounding material will thus increase with the intensity of heating. This nonlinear behavior as a function of heat input can place particular challenges on compensation for the image defects that arise, especially since this increases with the square of the temperature difference or of the heating. It should be noted here that the effect of the OH depletion generally increases with operating temperature, since customary polishing and measurement methods are conducted at room temperature (22° C.). Bulges or trenches above the cooling channels are therefore corrected at room temperature and will only occur again at an operating temperature distinctly different than room temperature.

Depending on the tempering program used and the local temperature relative to the average zero crossing temperature of the substrate, the OH depletion results either in circumferential tensile stresses or compressive stresses. Let us assume here that compressive stresses are established. The unconstrained depletion zone would have a lower density than the surrounding material. This firstly has the effect of expansion of the glass material into the cooling channel, which is not disruptive to any greater degree, and secondly of bulging of the surface to which the reflective coating is applied above the cooling channels. This is troublesome especially because processing of this surface is generally not possible at the later operating temperature of the mirror (see above), such that correction does not enable complete removal of these bulges. Since higher bonding temperatures and/or longer hold times are preferable with regard to strength, lack of drift of the bond and controllability of the zero crossing temperature, and the diffusion constant for OH groups rises with temperature (see FIG. 36 in "Brückner II"), this effect will become even more relevant in the case of higher bonding temperatures.

The substrate of the mirror described here will have a comparatively small lateral gradient of the zero crossing temperature and a comparatively small gradient in a thickness direction of the substrate above the cooling channel, such that the bulging of the surface described above, to which the reflective coating is applied, is comparatively minor. In a lower channel wall section of the channel wall, the effect of the gradient in the zero crossing temperature on the surface is typically comparatively small, such that there is generally no need to observe any constraint there on the zero crossing temperature.

In principle, however, it is nevertheless favorable when the cooling channel along the entire channel wall has a zero crossing temperature that deviates by less than 3.0 K, preferably by less than 2.0 K, in particular by less than 1.0 K, from an average zero crossing temperature in the bulk of the substrate. The zero crossing temperature in this case is averaged over all positions in the bulk of the substrate that are a distance of less than 1 cm away from the surface to which the reflective coating is applied. In lateral direction, the averaging is effected over all positions in the bulk of the substrate that are below an optically utilized region of the reflective coating in thickness direction and up to a lateral distance of 1 cm beyond the optically utilized region of the reflective coating. The optically utilized region refers here to a subregion of the reflective coating that makes an imaging light utilizable for further use after reflection.

As described above, the zero crossing temperature is influenced significantly by the OH content of the substrate, but can also be influenced by other effects. For example, similar concentration profiles are also established for a hydrogen or oxygen deficiency, or inverse profiles for the inward diffusion of metals, for example sodium. Sodium in particular diffuses particularly quickly; cf., for example, U.S. Pat. No. 9,382,151B2.

In a further aspect of the invention, which can in particular be combined with the aspect described above, a respective cooling channel has a channel wall which, at at least one position adjoining a respective land, in particular over an entire lateral wall section adjoining the respective land, has an OH content that deviates by not more than 60 ppm by weight, preferably by not more than 30 ppm by weight, in particular by not more than 20 ppm by weight, from an OH content at a middle of the respective land.

In one embodiment of this aspect of the invention, the channel wall at at least one position facing the surface to which the reflective coating is applied, in particular over an entire upper wall section facing the surface, has an OH content that deviates by not more than 60 ppm by weight, preferably by not more than 30 ppm by weight, in particular by not more than 20 ppm by weight, from an OH content at the surface.

As described above, the OH content of the glass has a significant influence on the zero crossing temperature and hence on the deformation that occurs at the surface of the mirror at the operating temperature. By compliance of the conditions described here on the OH content in lateral direction or in thickness direction, it is typically possible to comply with the above conditions for the zero crossing temperature of the substrate in lateral direction and in thickness direction, such that image defects in operation of the optical element can be significantly reduced.

It has been found that even small differences in the OH content of the quartz glass of, for example, 30 ppm can lead to a change in the zero crossing temperature of about 1 K, meaning that the effects of small variances in the OH content on the zero crossing temperature are considerable. Therefore, a distinct decline in the OH content from a maximum value of, for example, 180 ppm by weight or of 850 ppm by weight to 0 ppm by weight has severe effects on the zero crossing temperature, even when the thickness of the depletion region is only a few micrometers.

If the two part-bodies are heated separately in the hot bonding process and are only combined at elevated temperature, there is typically additionally OH depletion of the substrate material on either side of the bonding face where the two part-bodies are joined, since the surfaces of the two part-bodies along which the later bonding face runs lose OH groups prior to the joining. However, OH depletion along the bonding face is less disruptive since OH inhomogeneity or inhomogeneity of the coefficient of thermal expansion leads there essentially to a laterally constant change in thickness of the substrate. Moreover, this inhomogeneity after bonding is largely compensated for by the diffusion of OH groups from the substrate into the depletion zone.

In a hot bonding process in which the two part-bodies are contact-bonded prior to heating, by contrast, an elevated concentration of OH groups and $H_2O$ bound via hydrogen bonds is to be expected, which could diffuse into the material in subsequent hot processes. It is also to be expected that this will lead to a layer having a different coefficient of thermal expansion that has a relatively minor effect except at the edges toward the cooling channels, where there can also be a lateral OH gradient.

In one development, the channel wall at the at least one position adjoining the land, in particular over the entire lateral wall section, and/or at the at least one position facing the surface, in particular over the entire upper wall section, has an OH content of greater than 0 ppm by weight, preferably greater than 60 ppm by weight, in particular greater than 120 ppm by weight.

The hot bonding process typically takes place in a furnace in which the environment of the glass body which is formed in the joining of the two part-bodies is at a water vapor pressure that tends to zero since the furnace is operated with vacuum, air or inert gas with sufficient circulation. Because of the outward diffusion of OH groups described above without barrier action according to "Brückner II", the OH content at the channel wall is therefore 0 ppm by weight, meaning that the channel wall has a vanishingly small OH content. There are various ways of increasing the OH content at the channel wall and hence of reducing the gradient of the OH content by comparison with the average OH content in the bulk of the substrate, some of which are described hereinafter.

In order to reduce the OH gradient, for example, substrate material can be removed from the channel walls of the cooling channels. The thickness of the region removed depends on the thickness of the depletion region and on what OH gradient can be tolerated in the material of the substrate with regard to image defects. The thickness of the region removed also depends in particular on the size of the average or maximum OH content of the substrate, since the gradient of the OH content increases with the maximum OH content of the substrate.

There are various options for the removing of the material:

The cooling channels may be treated, for example, with an abrasive emulsion or an etch solution after the bonding. The emulsion has to be rinsed through under pressure in any case. In the case of the etch solution too, regular exchange or gradual rinsing is advisable in order to avoid overetching at the inlet and outlet of a respective cooling channel. However, both methods lead to roughening of the inside of the channel wall and to nonuniform removal, for example in any curved regions present in the channels. In the case of depletion regions that have a high thickness and would necessitate removal of 1 mm or more, this method is no longer practicable.

Rather than the standard hydrofluoric acid, it is also possible to use hot phosphoric acid as etch solution, which is much less toxic and etches more slowly. This offers the advantage that the cooling channels with hoses attached by flange connection can be purged over a longer period, which would not be possible with hydrofluoric acid for reasons of occupational safety. It is likewise possible to spatially control the etching effect by suitable preliminary damage, for example by means of a short-pulse laser. The preliminary damage can be effected either before the two part-bodies have been joined, into the open cooling channels or into the machined depressions, or after the hot bonding through the surface to which the reflective coating is applied at a later stage. It is also possible to control the etching operation in situ by means of an ultrasound treatment. The exposure to light or sound through the later mirror surface permits improved removal preferably at the top side of the lateral channel wall section of the cooling channel and in the upper region of the lateral channel wall sections. As described above, these are exactly the regions where inhomogeneity of the coefficient of thermal expansion or of the zero crossing temperature is particularly troublesome. The heat loads removed at the mirror surface in the operation of the mirror lead to a maximum increase in temperature at the top side of the channel or in the upper channel wall section and to a constant decrease with increasing depth, such that barely any increase in temperature still occurs at the bottom side of the channel or in the lower channel wall section.

Especially in conjunction with preliminary damage, it is also possible to use alkalis as etchant. It is known that, in quartz glass, short-pulse laser preliminary damage can achieve an etch rate of 300 μm/h in the case of 8 molar KOH at 80° C. with ultrasound assistance. The etch selectivity is 1:1400, meaning that only 0.2 μm/h at worst is achieved without preliminary damage. In the case of 100 μm of material removed, that would mean three weeks, which is a tolerable duration for the material removal, especially since titanium-doped quartz glass may have a slightly higher etch rate. Alternatively, it would be possible to increase the temperature and concentration of the alkali somewhat further, especially since the boiling point of a concentrated alkali should be well above 100° C. (50% sodium hydroxide solution has a boiling point of 143° C., and 45% potassium hydroxide solution 136° C.). On exceedance of the boiling point, a pressure vessel would be needed, but this only increases apparatus complexity. It is possible to proceed more aggressively in terms of the etch parameters without the use of preliminary damage, since there is of course no intention to achieve etch selectivity.

It is additionally quite likely that OH-depleted quartz glass will have a higher etch rate than non-depleted quartz glass since the OH acts as matrix terminator, i.e. gives the glass matrix additional degrees of freedom, because there is no need for crosslinking with neighboring tetrahedra at a tetrahedral vertex with compliance with the bonding angles. If OH diffuses out, it is unlikely that two defects will be able to combine to form a covalent bond, i.e. it can be assumed that these defects constitute preliminary damage. If this is the case, the depletion zone will be removed in a largely self-controlled manner, i.e. irrespective of any flow conditions in the case of active purging with etch solution. It is possible that, in this case, acids are more effective than alkalis since alkalis replenish the missing OH. On the other hand, acids afford a proton, which can likewise act as matrix terminator.

In general, in the removal of material, the use of slow etchants (phosphoric acid or alkali) is advantageous since, in the case of a relatively low etch rate, it is also possible to work with extremely low flow rates, and hence the problem that the highest etching removal also occurs at sites of high flow rate does not arise.

It is also possible to use gaseous etching media, for instance the evaporated gas from concentrated hydrofluoric acid or fluorinated organic substances as used for fluorine doping of soot glasses.

It will be apparent that, in the production of the substrate from the glass body formed by hot bonding, the depletion zone will typically also be removed at the surface at which the reflective coating is applied, and at the opposite surface at the base of the glass body or of the second part-body. The surface of the first part-body to which the reflective coating is applied and the base of the second part-body permit simpler removal of the depletion zone since it is readily accessible. However, specifically the material of the first part-body must be of the very highest quality with regard to homogeneity and freedom from bubbles. Removal of a few millimeters or even a few centimeters quickly meets limits with regard to costs, but also the producibility of high-quality glass blocks of appropriate weight.

In mechanical removal methods, as well as purging with an abrasive emulsion, it is also possible to introduce rotating brushes or sponges into the cooling channel. It is also possible to introduce dry grinding particles or a grinding fluid with a maximum difference in the density of the fluid and the particles. The particles can be agitated by means of ultrasound or vibration of the entire glass body by means of a shaker. It is also possible to use ferromagnetic particles and an external magnetic field. The external field may be an alternating field, in order to set the particles in vibration. The field may alternatively be a quasistatic, moving field, in which case the vibrations are additionally generated by a shaker. This would have the advantage that the site and direction of material removal could be controlled, i.e., for example, unwanted increased removal in areas of elevated speed of movement can be counteracted.

In addition, removal of material can be generated by generation of cavitation bubbles in a liquid, where the bubbles can be generated, for example, by focused ultrasound, electrical discharges or laser pulses. If the liquid simultaneously has etching action, locally controllable removal of material is possible in this way.

In a further embodiment, a depletion region adjoining the channel wall in which the OH content of the substrate is at least 5 ppm by weight lower than the OH content in the middle of the respective land and/or at the surface has a thickness of less than 50 $\mu$m, preferably of less than 30 $\mu$m, in particular of less than 1 $\mu$m. As described above, the thickness of the depletion region can be reduced by removing material from the channel walls. The thickness of the material which is removed and also the thickness of the depletion region depend on factors including the steepness of the gradient of the OH content in the substrate.

As described above, it is generally the case that the extent to which OH depletion is troublesome increases with the difference between the operating temperature of the mirror and the polishing temperature at which the bulges or trenches above the cooling channels are corrected (typically 22° C.). A greater operating temperature therefore necessitates greater removal of material. Therefore, the tolerable residual decline in the OH content in the depletion region is inversely proportional to the difference between the polishing temperature and the operating temperature. In the case of a polishing temperature of 22° C. and an operating temperature of 25° C., it may be sufficient to remove the depletion region only from 0% to 20% of the average OH content in the bulk of the substrate; in the case of an operating temperature of 35° C., it would be necessary, as the case may be, to remove 0% to 90% of the average OH content in the bulk of the substrate. In the first case, the thickness of the depletion region that remains after the material removal would therefore be greater than in the second case. The thickness of the material removed also depends on the absolute value of the OH content within the substrate. Given a maximum OH content of the substrate of about 200 ppm by weight, with an operating temperature of 25° C., it is generally sufficient when material is removed within a range between 0% and 20% of the maximum OH content; if the maximum OH content is 800 ppm by weight, it is typically necessary for material to be removed at the channel wall that has an OH content between 0% and 50% by weight of the maximum OH content, i.e. it is necessary to remove correspondingly more material.

In a further embodiment, an OH content at the channel wall deviates by less than 10%, preferably by less than 5%, in particular by less than 1%, from an average OH content in the bulk of the substrate (i.e. outside the cooling channels).

In the embodiments described above, OH depletion occurs in a volume region adjoining the channel wall, i.e. OH content is reduced compared to the OH content in the bulk of the substrate. It is alternatively possible in principle for the average OH content of the substrate in the region adjoining the channel wall to be greater than the average OH content of the substrate. This may be the case when hot bonding is conducted under suitable ambient conditions, especially in saturated water vapor, and/or when an aftertreatment of the substrate or of the glass body formed in the hot bonding is effected. It should be noted here that an increase in the OH content beyond the average OH content also leads to an unwanted OH gradient that should be avoided.

The average OH content of the substrate or substrate material can be determined, for example, by FTIR or IR spectroscopy or Raman spectroscopy. The ideal OH content for the hot bonding process or for the aftertreatment can be calculated with knowledge of the diffusion factor, and the partial pressure of water vapor can be adjusted accordingly. In apparatus terms, the correct partial pressure can be effected via a restriction of the injection of water, by addition of dry air or by an appropriate suction that creates reduced pressure. Since the diffusion ratio decreases at lower temperatures, it is typically necessary, as the case may be, to track and lower the partial pressure of water vapor in the cooling phase of the hot bonding process in accordance with a prior calculation. The hot bonding under water vapor or the aftertreatment, especially in the case of (titanium-doped) quartz glass deposited in a soot process, can achieve the effect that the OH content at the channel wall or in a region adjoining the channel wall deviates only by less than about 10%, 5% or possibly 1% from the average OH content in the bulk of the substrate.

A factor in principle that opposes hot bonding in water vapor is that the outward diffusion of surface water and water of condensation in the conversion of SiOH groups bonded via hydrogen bonds to matrix bonds Si—O—Si can also no longer readily diffuse laterally out of the bonding face.

A factor that opposes aftertreatment by subsequent replenishment with OH groups in the form of heat treatment in saturated water vapor or water is that the aftertreatment process takes at least as long as the original hot bonding and, during that time, there can be variation in other material properties, for example the coefficient of thermal expansion. Moreover, it is generally not directly possible in so doing to compensate for the profile of shortcomings of the OH content, especially since it cannot be detected readily by measurement on a micrometer scale. An additional factor is that, according to FIG. 36 and section 5.1.3.2 of the article "Bruckner II", the outward diffusion has a significantly higher diffusion constant than the inward diffusion (see above), and so such a process, which generally has to take place at a lower temperature than the bonding, is very time-consuming. In any case, maximum partial pressure of the water or water vapor should be employed at any temperature, since solubility increases with the square of vapor pressure.

A combination of replenishment of OH groups and hot bonding has been found to be favorable, in which water vapor is supplied with a time delay. In this case, the hot bonding is firstly commenced under dry conditions, and a hold step for several hours or days at 120° C. to 250° C. is implemented for the outward diffusion of the surface water, and optionally a further hold step of several hours at 500-600° C. for outward diffusion of the water of condensation, before water vapor is then added. Since the outward diffusion rates at the lower temperatures are still moderate according to "Brückner II", the replenishment can be effected efficiently in the hold step in the hot bonding which is necessary any case. The outward diffusion of the OH groups can therefore typically be distinctly reduced when, in particular, the tempering steps at the highest temperature in the hot bonding are effected in water vapor of maximum saturation.

If this is impracticable, at least an oxidizing atmosphere should be used in the hot bonding operation. At the surfaces of the portions where the bonding face is formed, there are unsaturated Si and Ti bonds, and also unsaturated Si—O and Ti—O bonds, and also the saturated forms SiH and TiH and Si—OH and Ti—OH, where the OH groups are dominant in a standard atmosphere in particular. When the surfaces have been exposed to ambient air beforehand, OH groups will thus be dominant. These can only become water if hydrogen is supplied thereto, which either diffuses out of the substrate or the glass body or comes from the furnace. In an oxidizing atmosphere, such hydrogen is oxidized directly to water vapor and therefore cannot bind to an OH group. In a reducing atmosphere, residual water can react with the furnace wall or auxiliaries such as molds (which frequently consist of graphite), which releases hydrogen. The oxidizing atmosphere thus creates an artificial exit barrier for the OH groups at the surface. As a result, the concentration profile is no longer determined solely via the volume diffusion coefficient, and a non-zero concentration is established at the surface.

With regard to the question of which parameters are necessary for bonding in saturated water vapor or for an aftertreatment, the solubility of the OH groups is crucial. R. H. Doremus, Glass Science, 2nd ed., Wiley, New York 1994, pages 198-199) reports solubility in quartz glass for the range of 700-1200° C. to be $3 \times 10^{-3}$ SiOH groups per $SiO_2$ group at vapor pressure 700 mm Hg. This and the article "Water in Silica Glass", A. J. Moulson and J. P. Roberts, Trans. Faraday Soc., 1961, 57, 1208-1216, also state that solubility rises with the square of vapor pressure. Conversion with mass numbers (OH 17, SiO2 60) gives a solubility of 850 ppm of OH, which corresponds to the typical OH content of directly deposited quartz glasses or titanium-doped quartz glasses. In the production of these glasses, the rate of new glass growth is faster than that of outward diffusion of OH groups; there is therefore no need to take account of the outward diffusion of OH groups.

In the hot bonding operation, however, no new glass is deposited; in other words, outward diffusion has to be taken into account. For directly deposited glass, replenishment or prevention of the outward diffusion of OH groups at partial pressures of water vapor close to 100% is possible, and for soot glass with a OH content around 200 ppm at partial pressures of water vapor around 25%. In apparatus terms, the appropriate vapor pressure can be effected by means of an evaporator dish or water injection and via closed-loop control of fresh gas purging and the ratio of air inlet and air outlet pressure. At partial pressures around 100%, it is possible to dispense with or reduce the level of purging and to use a pressure release valve. Even the actual bonding can take place under a moist atmosphere.

In the performance of the hot bonding process, in both cases, i.e. either in the case of a directly deposited quartz glass or in the case of a quartz glass deposited by a soot process, it is possible to dispense with removal of material from the channel wall because only a small and tolerable decline in the OH content occurs.

In a further embodiment, the channel wall is covered at least partly, in particular completely, by a preferably metallic protective coating in order to prevent the outward diffusion of OH groups. Typically, any kind of metallic layer or coating significantly suppresses the outward diffusion of OH groups. Suitable metals should have a melting point above the highest process temperature in the hot bonding operation. Chromium in particular has good applicability and structurability and has a sufficiently high melting point.

In the case of a protective coating in the form of one or more metal layers that are to be applied to the unbonded part-body, it should be noted that washing operations are still necessary before the joining, especially in the case of contact bonding. The materials and/or the washing processes should therefore be selected such that the protective coating or layers thereof are not attacked.

Ideally, a respective cooling channel is metallized over the entire extent of the channel wall and optionally also the later mirror area, or even all the surfaces of the portions or of the glass body that are exposed to the atmosphere during the hot bonding. A sufficient number of methods of metallizing nonconductors are known, although the requirement for an inner coating of the cooling channels limits the selection somewhat. Possible methods include those with sputtering application, initial deposition from the gas phase or from a liquid after initial etching. As soon as what is called a primer layer has been applied, a thicker layer of another metal as well is applied electrolytically. It is possible that the primer layer is applied before the hot bonding and the thicker layer only after the hot bonding.

In principle, it is possible that the protective layer remains in the respective cooling channel after the hot bonding, but it is also possible that the protective layer, for example because of its effect on the coefficient of thermal expansion, after the hot bonding, is removed again by etching or by electrolysis.

As described above, the entire channel wall of the cooling channel can be covered by the protective coating, but it is likewise possible that solely the upper wall section and the lateral wall sections of the cooling channel are covered wholly or, if appropriate, only partly (see below) by the protective layer. Such a protective coating can be applied in a particularly simple manner when a depression is being machined into the first part-body and the second part-body is not being processed, such that the cross section of the cooling channel is entirely within the first part-body. In that case, the first part-body may be coated fully at the surface that forms the later bonding face, including the still-open cooling channels or depressions. A grinding or polishing step removes the metal layer at the later bonding face, so as to leave three-sidedly coated open cooling channels. The second part-body in this case may remain uncoated or is coated only in the region of the later cooling channels.

As described above, the optionally masked or differently structured layer that has been applied prior to the bonding may be made quite thin and may serve merely as primer for further galvanization or chemical deposition from solution after the hot bonding. This results in growth of the layer in terms of thickness, but also laterally along the coated surface(s). If the metallization in the region of the portion that has not been provided with cooling channels (the second part-body in the present example) is only a few tens of micrometers narrower than the channel width, this lateral growth may be sufficient to close the gaps and to provide the channel wall in its entirety with the metallic protective coating.

In the case of ground and optionally etched cooling channels, a surface roughness Ra of 5-10 μm at the channel wall is to be assumed. Specifically when the metallization has been applied by vapor deposition or sputtered, it can be assumed that it will not completely fill the valleys of the roughness landscape. Here too, subsequent galvanization or chemical deposition can have the effect of filling these gaps.

The method with seamless metallization can of course also be used when the channels have been incorporated into the second part-body and the first part-body serves as a lid to close the cooling channels.

As described above, in the hot bonding process, there can also be inward diffusion of sodium and other metals. This unwanted inward diffusion can be reduced by measures known from quartz glass for applications at a wavelength of 193 nm, such as acidification of the workpieces, use of particularly pure or halogen-free auxiliaries, suitable furnace lining and cooling of metallic surfaces. Furthermore, the metallic protective coating described above, especially with use of chromium, or the removal of material after hot bonding described above, acts against high concentration gradients of metals close to the surface.

It may be advantageous when the metallization or metallic protective layer has defined interruptions (for example slots), since the metal layer has a different coefficient of thermal expansion than the glass and therefore has the effect during tempering that stresses are introduced and frozen into the surrounding glass and are only partly alleviated on removal of the metal layer. These stresses are constant over the lifetime of the mirror and change only little with temperature, but if they cause birefringence locally in the region of a few tens of nm/cm, this can lead to stress effects at the mirror surface, for example in the form of selective material removal.

In one embodiment, the channel wall has a plurality of corner regions and is covered by the protective coating only outside the corner regions. The cooling channel generally has an essentially rectangular cross section with an upper channel section, a lower channel section and two lateral channel sections that each adjoin the corner regions. In principle, however, different cross-sectional geometries are also possible that have more or fewer corner regions or possibly no corner regions, as is the case, for example, in a cooling channel with a round cross section.

It is possible that the protective coating covers a respective channel cross section except for the corner regions. In that case, there is local depletion of OH in the corner regions. But since these corner regions are insulated, it is possible in this case, unlike in the case of annular or tubular depletion, for only a much smaller temperature-dependent force to be built up that would lead to curvature of the glass above the cooling channels.

In a further development, the channel wall is not covered by the protective coating along slots that extend in longitudinal direction of the cooling channel, preferably that run obliquely to the longitudinal direction. It is possible that, for example, a lateral channel section or a side wall of the cooling channel has oblique slots in the protective coating. This reduces the force applied by the protective coating in longitudinal direction of the cooling channel. The slots may also be continued, for example, in the form of a helix or the like over all the wall sections of the cooling channel.

After contact bonding of hydrophilic glass surfaces, one or more monolayers of water that remain on the later bonding face hinder the desired formation of covalent bonds in the bonding operation. Typically, the water molecules can diffuse out along the plane of the bond or bonding face in the course of heating. If, however, a continuous metallization has been created prior to the bonding operation, including the open sides of the plane of the bond, this outward diffusion is suppressed, and all that remains is the very gradual diffusion of water into the substrate. It may be advantageous to bake the contact-bonded portion that has not yet been metallized, or not yet been seamlessly metallized, at 100 to 400° C. for a few hours to a few weeks in order to drive out the water from the gap. Only thereafter are the insides of the channel metallized, or a masked partial metallization thickened, including the closing of the cutouts.

In a further embodiment, the first part-body, preferably the whole substrate, has a maximum OH content of less than 10 ppm by weight. The lower the absolute OH content, the lower the gradient in the OH content established after hot bonding as well. Accordingly, there is also a reduction in the gradient of the zero crossing temperature in the substrate and hence in the deformation of the surface with the reflective coating, or in the image defects that are generated in the operation of the optical element at the operating temperature. In order to achieve such a low OH content, the OH content of the quartz glass can be reduced by suitable thermal drying or chemical drying (for example by means of halogens). Chemical drying can be performed only in a soot process prior to sintering; thermal drying can precede or follow the sintering, although thermal drying after sintering takes much longer. In the course of thermal drying, the two part-bodies may be tempered individually or collectively at temperatures above 1400° C., preferably above 1600° C., for several days or weeks before the two part-bodies are joined by hot bonding. For the drying, it is unnecessary, or not very favorable, for the recesses that form the cooling channels at a later stage to have already been introduced into a respective portion, since these would change shape at the temperatures at which the thermal drying is conducted. The chemical or thermal drying described above makes it possible to produce quartz glasses having an OH content of less than 1 ppm by weight.

In a further aspect of the invention, which can in particular be combined with the aspects of the invention described above, the channel wall of a respective cooling channel has at least one slot-shaped depression, the depth of which is preferably at least equal to and more preferably at least twice the thickness of the depletion region. The slot-shaped depression(s) typically have a width of less than 100 µm and are introduced into at least one of the portions prior to the hot bonding. The depth of the slot-shaped depressions should exceed the thickness of the depletion region by a factor of 1, 2 or 5, but generally not more than 5, where the depletion region, as described above, is defined as the region in which the OH content is at least 5 ppm by weight less than the OH content in the middle of the respective land or at the surface. The OH depletion during the hot bonding spreads around the slot-shaped depressions, but the ring formed by the depletion region (based on the cross section of the cooling channel) or the tube (based on the overall cooling channel) is weakened, such that there is reduced temperature-dependent curvature or recessing above the cooling channels. If the slot-shaped depressions are unfavorable for flow purposes ("flow-induced vibrations"), they may, for example, be smeared with a soft organic mass after the hot bonding, or an inliner (hose) may be introduced into the respective cooling channel prior to the operation of the mirror.

In one development, the channel wall has a plurality of corner regions, and the at least one slot-shaped depression is formed in one of the corner regions. As described above, the cooling channel generally has a polygonal, in particular rectangular, cross section, where an upper and lower channel wall section adjoin two lateral channel wall sections in corner regions. The slot-shaped depressions are preferably formed at the corner regions, where the lower channel wall section adjoins the two lateral channel wall sections. The slot-shaped depressions preferably extend here either in thickness direction of the substrate or transverse to thickness direction. The slot-shaped depressions need not be introduced in the corner regions, but may, for example, be introduced into the middle of the lateral channel walls or introduced in helical form or obliquely in sections into the wall sections of the channel wall.

In a further embodiment, the first part-body, in particular the entire substrate, has a maximum hydrogen content of not more than $1\times10^{15}$ molecules/cm$^3$, preferably of not more than $1\times10^{14}$ molecules/cm$^3$.

The studies relating to the diffusion constants of OH groups in the article "Brückner II" took place in semisynthetic glass having an OH content comparable to soot glass and lower than directly deposited glass. Nothing is known about the H2 content of the quartz glass examined therein, probably because Raman measurements were not widely used at the time. On the basis of the production described therein by melting in a hydrogen-oxygen gas flame, an OH content of $1\times10^{15}$ to $5\times10^{16}$ molecules/cm$^3$ can be assumed. Titanium-doped quartz glass from a soot process is intrinsically hydrogen-free, but the glass, for use in mirrors for projection systems for EUV lithography, generally has to be homogenized, which would probably lead to an input in the range from $1\times10^{15}$ to $5\times10^{15}$ molecules/cm$^3$. Directly deposited titanium-doped quartz glass has an H2 content of typically about $1\times10^{17}$ molecules/cm$^3$. Directly deposited quartz glasses actually reach H2 contents up to nearly $1\times10^{20}$ molecules/cm$^3$, and so this should also be expected for titanium-doped glasses in a corresponding process regime.

The article "Brückner II" does not address the causes of asymmetry between outward diffusion and inward diffusion of OH groups. Part of the explanation might be the necessary activation energy for the splitting of H$_2$O. However, it can be assumed that the glasses used in those studies contained hydrogen. Hydrogen diffusion is determined by solubility and partial pressure. In high-purity quartz glass, at 1 atm in 100% hydrogen at about 400° C., saturation of the dissolved hydrogen occurs at about $5\times10^{17}$ molecules/cm$^3$; at lower temperatures, solubility is increased further, but the diffusion constant falls. It follows that hydrogen-containing quartz glasses, at all temperatures from room temperature up to the process temperatures in hot bonding, lose hydrogen from the bulk via the surface if the surrounding atmosphere is largely free of hydrogen.

In order that an OH group in the form of Si—OH can become detached from the surface or from a near-surface region of the glass body and evaporate in the form of water vapor, it must acquire a hydrogen.

The easiest way of doing so is according to the equation. SiOH+H2→SiH+H$_2$O, provided that a hydrogen molecule is available.

If none is available, the hydrogen has to come from another OH group:

$$2\,SiOH \rightarrow H_2O + Si + SiO.$$

Both species are already energetically unfavorable in the bulk of the glass (E' or NBOH center). They would have to recombine at the surface, which is quite unlikely at temperatures below 1000° C., or they would have to trap water again, which virtually stops outward diffusion. The use of very low-hydrogen glass thus creates an exit barrier for OH groups, similarly to the use of an oxidizing atmosphere.

In the embodiment described here, it is therefore proposed that a hydrogen-free or low-hydrogen glass be used for the production of the substrate. Since standard glasses for EUV mirrors contain hydrogen for process-related reasons, this can be diffused out in a controlled manner. As shown by FIG. 36 from the article "Brückner II", the diffusion constant of hydrogen at temperatures around 400° C. is about 5 orders of magnitude above that of OH. It is thus possible to temper out the hydrogen without significantly influencing the OH distribution. At temperatures around 800° C., the difference is still about 3 orders of magnitude, which also permits sufficient differentiation.

In one development of this embodiment, the second part-body, at a distance from a lower wall section of the cooling channel which corresponds at least to a land width and preferably to not more than ten times a land width of a respective land and/or which corresponds to the thickness of the first part-body and to not more than ten times the thickness of the first part-body between an upper section of the channel wall and the surface having the reflective coating has a hydrogen content which is not more than 50% of the average hydrogen content of the second part-body.

Since the inhomogeneities of the coefficient of thermal expansion in the glass are troublesome, especially between the surface to which the reflective coating is applied and the cooling channels and in some cases up to half the channel height, the critical thickness used for the outward diffusion of hydrogen should be the thickness of the glass above the cooling channel or the land width between the channels. The hydrogen concentration in the middle of the cover or in the middle of the land should preferably be $1 \times 10^{14}$ molecules/cm³ or less.

In the direction of the second part-body below the lower wall section, it is generally sufficient when the hydrogen content at a distance of from 1 to 10 times the cover thickness or the land width falls to 50% of its maximum within the substrate of the second portion. As a result, there is still slight OH depletion at the base or at the lower wall section of the cooling channel and the lower regions of the lateral wall sections, but this, as set out above, is no longer such a major factor.

The hydrogen content is typically detected via Raman spectroscopy, although spatial resolutions below 1 mm are barely achievable (except in the case of micro-Raman spectroscopy), and the detection limit in OH-rich quartz glasses is typically 1 to $5 \times 10^{15}$ molecules/cm³. Suitable hydrogen distributions can be detected via measurement points in the middle of the cover or land and a sequence of measurement points from the channel base further into the substrate and/or corresponding diffusion calculations.

A further aspect of the invention relates to an optical arrangement, in particular an EUV lithography system, comprising: at least one optical element formed in the manner described further above, and a cooling device which is designed for the flowing of a cooling liquid through the plurality of cooling channels. The EUV lithography system can be an EUV lithography apparatus for exposing a wafer, or can be some other optical arrangement that uses EUV radiation, for example an EUV inspection system, for example for inspecting masks, wafers or the like that are used in EUV lithography. The reflective optical element may in particular be a mirror of a projection system of an EUV lithography apparatus. The cooling device may be designed, for example, to cause a cooling liquid in the form of cooling water or the like to flow through the at least one cooling channel. For this purpose, the cooling device may optionally have a pump and also suitable feed and drain conduits.

Further features and advantages of the invention will be apparent from the description of working examples of the invention that follows, with reference to the figures of the drawing, which show details salient to the invention, and from the claims. The individual features can each be realized individually by themselves or as a plurality in any desired combination in a variant of the invention.

BRIEF DESCRIPTION OF THE DRAWINGS

Working examples are shown in the schematic drawing and are elucidated in the description which follows. The figures show.

DETAILED DESCRIPTION

In the description of the drawings that follows, identical reference signs are used for components that are the same or have the same or analogous function.

Figure 1:
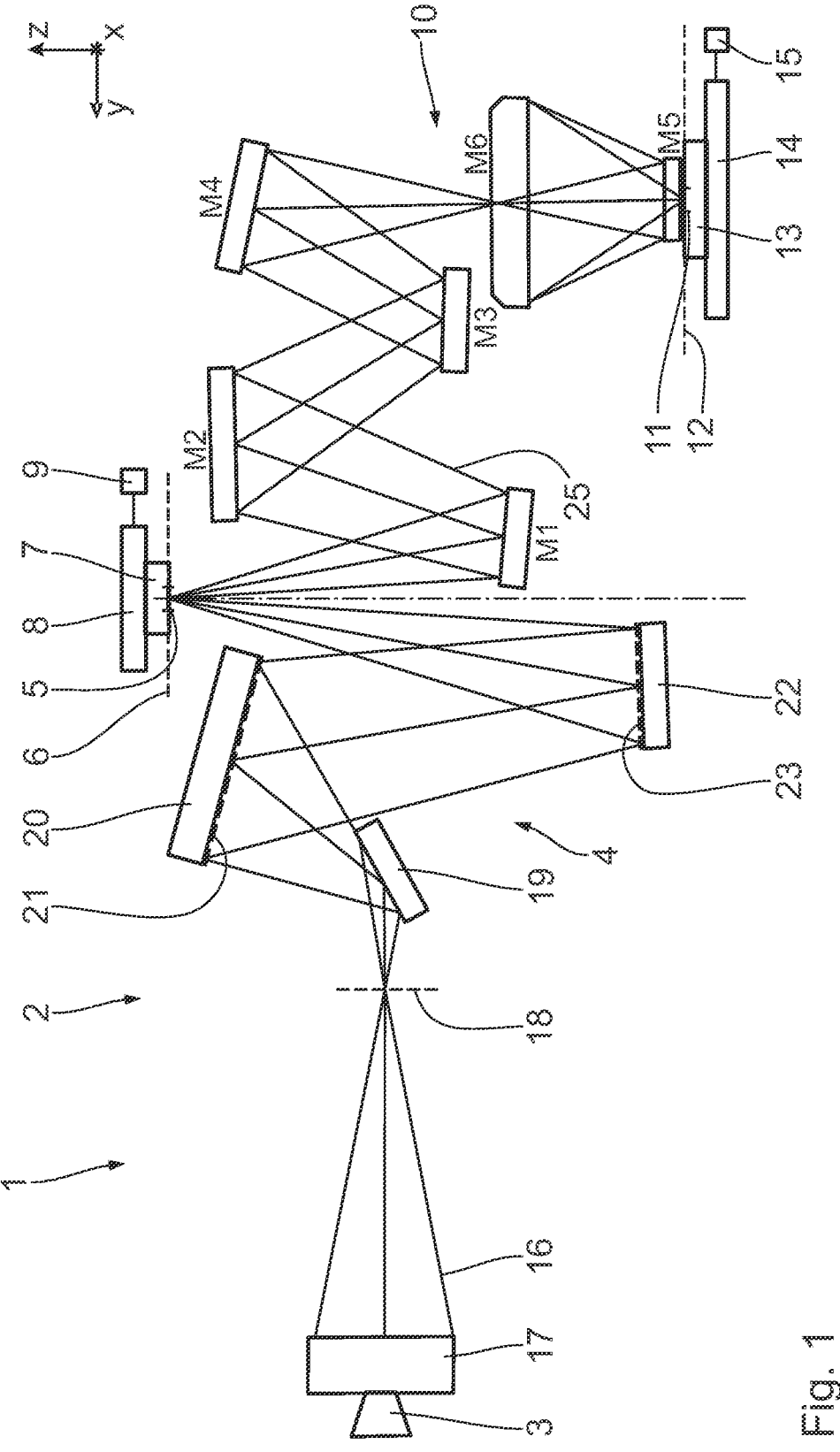
FIG. 1 a schematic meridional section through a projection exposure apparatus for EUV projection lithography, FIGS. 2A and 2B schematic diagrams of a blank of titanium-doped quartz glass having two part-bodies that have been bonded to one another by hot bonding, either collectively (FIG. 2A) or separately (FIG. 2B), along a bonding face in the region of a plurality of cooling channels, FIG. 3A a schematic diagram of an optical element that has been produced from the quartz glass blank from FIG. 2A, in exposure operation, FIG. 3B a schematic diagram analogous to FIG. 3A, in which material has been removed from the channel wall of the cooling channels, FIGS. 4A-4D schematic diagrams of a metallic protective coating applied in various exemplary forms to the channel walls for prevention of the formation of an OH depletion zone in the hot bonding operation: along entire circumference (FIG. 4A), with oblique flanks (FIG. 4B), with slots in corner regions (FIG. 4C), and with oblique slots (FIG. 4D), FIGS. 5A-5C schematic diagrams of the walls of a cooling channel into which slot-shaped depressions have been introduced in order to reduce stresses caused by the OH depletion zone: into the first part-body (FIG. 5A), into the second part-body (FIG. 5B), and into the second part-body which also includes the cooling channel (FIG. 5C), FIG. 6 a schematic diagram of the distribution of the hydrogen content in a blank composed of titanium-doped quartz glass in the tempering-out of hydrogen, FIG. 7A a schematic diagram of the temperature progression in a tempering process with a hold temperature of 1080° C. on a blank composed of titanium-doped quartz glass, FIG. 7B a schematic diagram of a distribution of the OH content in the blank composed of titanium-doped quartz glass after the tempering process of FIG. 7A, FIGS. 8A and 8B schematic diagrams analogous, respectively, to FIGS. 7A and 7B for a tempering process with a hold temperature of 650° C., FIGS. 9A and 9B schematic diagrams analogous, respectively, to FIGS. 7A and 7B for a tempering process with a hold temperature of 1200° C., FIGS. 10A and 10B schematic diagrams of the OH content in a blank composed of directly deposited quartz glass in hot bonding in saturated water vapor (FIG. 10A) or when the OH content is subsequently increased (FIG. 10B), and FIGS. 11A and 11B schematic diagrams respectively analogous to FIGS. 10A and 10B for a blank composed of quartz glass that has been produced in a soot process.

There follows a description with reference to FIG. 1 by way of example of the primary constituents of an optical arrangement for EUV lithography in the form of a projection exposure apparatus 1 for microlithography. The description of the basic setup of the projection exposure apparatus 1 and the components thereof should not be considered here to be restrictive.

One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 may also be provided in the form of a module separate from the rest of the illumination system. In this case, the illumination system does not include the light source 3.

A reticle 7 arranged in the object field 5 is illuminated. The reticle 7 is held by a reticle holder 8. The reticle holder 8 is displaceable, in particular in a scanning direction, by way of a reticle displacement drive 9.

By way of elucidation, FIG. 1 shows a Cartesian xyz coordinate system. x direction runs perpendicularly into the plane of the drawing. y direction runs horizontally, and z direction runs vertically Scanning direction runs in y direction in FIG. 1. z direction runs perpendicularly to the object plane 6.

The projection exposure apparatus 1 comprises a projection system 10. The projection system 10 is used to image the object field 5 into an image field 11 in an image plane 12.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable, in particular in y direction, by way of a wafer displacement drive 15. The displacement firstly of the reticle 7 by means of the reticle displacement drive 9 and secondly of the wafer 13 by means of the wafer displacement drive 15 may be mutually synchronized.

The radiation source 3 is an EUV radiation source. The radiation source 3 emits, in particular, EUV radiation 16, which is also referred to below as used radiation, illumination radiation or illumination light. In particular, the used radiation has a wavelength in the range between 5 nm and 30 nm. The radiation source 3 may be a plasma source, for example an LPP source (Laser Produced Plasma) or a GDPP source (Gas Discharge Produced Plasma). It may also be a synchrotron-based radiation source. The radiation source 3 may be a free electron laser (FEL).

The illumination radiation 16 emanating from the radiation source 3 is focused by a collector mirror 17. The collector mirror 17 may be a collector mirror with one or more ellipsoidal and/or hyperboloidal reflection surfaces. The illumination radiation 16 may be incident on the at least one reflection surface of the collector mirror 17 with grazing incidence (GI), i.e. at angles of incidence of greater than 45°, or with normal incidence (NI), i.e. at angles of incidence of less than 45°. The collector mirror 17 may be structured and/or coated, firstly to optimize its reflectivity for the used radiation and secondly to suppress extraneous light.

The illumination radiation 16 propagates through an intermediate focus in an intermediate focal plane 18 downstream of the collector mirror 17. The intermediate focal plane 18 may constitute a separation between a radiation source module, comprising the radiation source 3 and the collector mirror 17, and the illumination optical unit 4.

The illumination optical unit 4 comprises a deflection mirror 19 and, downstream thereof in the beam path, a first facet mirror 20. The deflection mirror 19 may be a planar deflection mirror or, alternatively, a mirror with a beam-influencing effect going beyond the pure deflection effect. As an alternative or in addition, the deflection mirror 19 may be in the form of a spectral filter that separates a used-light wavelength of the illumination radiation 16 from extraneous light of a different wavelength. The first facet mirror 20 comprises a plurality of individual first facets 21, which are also referred to below as field facets. FIG. 1 depicts only some of these facets 21 by way of example. In the beam path of the illumination optical unit 4, a second facet mirror 22 is arranged downstream of the first facet mirror 20. The second facet mirror 22 comprises a plurality of second facets 23.

The illumination optical unit 4 thus forms a double-faceted system. This basic principle is also referred to as a fly's eye integrator. With the aid of the second facet mirror 22, the individual first facets 21 are imaged into the object field 5. The second facet mirror 22 is the last beam-shaping mirror or indeed the last mirror for the illumination radiation 16 in the beam path upstream of the object field 5.

The projection system 10 comprises a plurality of mirrors Mi, which are consecutively numbered in accordance with their arrangement in the beam path of the projection exposure apparatus 1.

In the example illustrated in FIG. 1, the projection system 10 comprises six mirrors M1 to M6. Alternatives with four, eight, ten, twelve or any other number of mirrors Mi are likewise possible. The second-last mirror M5 and the last mirror M6 each have a passage opening for the illumination radiation 16. The projection system 10 is a doubly obscured optical unit. The projection optical unit 10 has an image-side numerical aperture that is greater than 0.4 or 0.5 and may also be greater than 0.6, and may, for example, be 0.7 or 0.75.

Just like the mirrors of the illumination optical unit 4, the mirrors Mi may have a highly reflective coating for the illumination radiation 16.

Figures 2A, 2B:
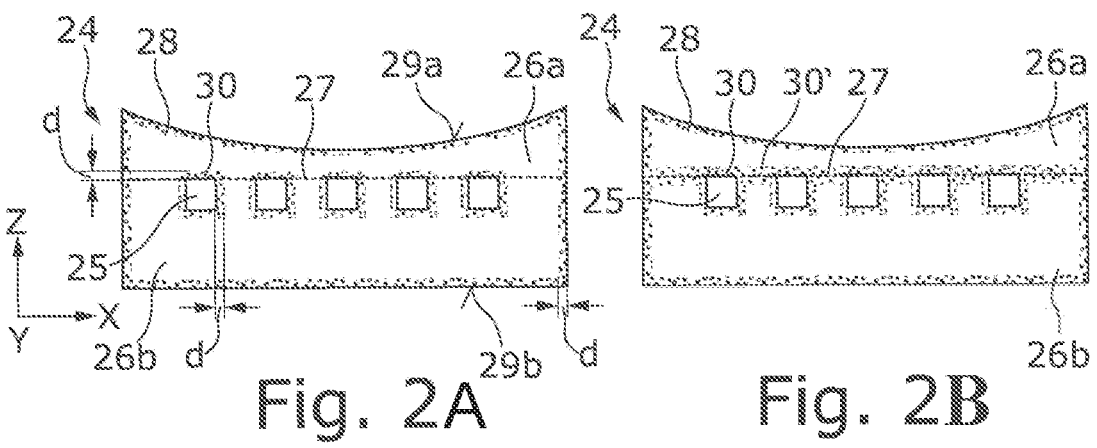

A respective mirror Mi is produced using a glass body 24 composed of titanium-doped quartz glass that has a plurality of cooling channels 25, as shown in FIGS. 2A and 2B. The glass body 24 has a first, upper part-body 26a and a second, lower part-body 26b that are joined by hot bonding along a bonding face 27, which is planar in the example shown. The two part-bodies 26a, 26b are formed from a solid glass body (without cooling channels) in that the solid glass body is sawn open along a division face, which is planar in the example shown.

For the production of the glass body 24 shown in FIGS. 2A and 2B, the lower part-body 26b is first processed mechanically. In the mechanical processing, a plurality of depressions are machined into the quartz glass material of the lower part-body 26b, and these, in the example shown, have an essentially square or rectangular cross section. It will be apparent that the depressions can alternatively be machined into the first part-body 26a. It is likewise possible that depressions are machined into both part-bodies 26a,b, and these form the cross section of a respective cooling channel 25 after joining.

In the example shown in FIG. 2A, the first part-body 26a is placed onto and contact-bonded to the second part-body 26b at room temperature on the processed surface that forms the later bonding face 27. Subsequently, the two part-bodies 26a,b are collectively subjected to a hot bonding process in which the two part-bodies 26a,b are bonded to one another along the bonding face 27. In the example shown in FIG. 2B, by contrast, the first part-body 26a and the second part-body 26b are first heated up separately to a high temperature and only thereafter bonded to one another to give the glass body 24.

Figures 7A, 7B, 8A, 8B, 9A, 9B:
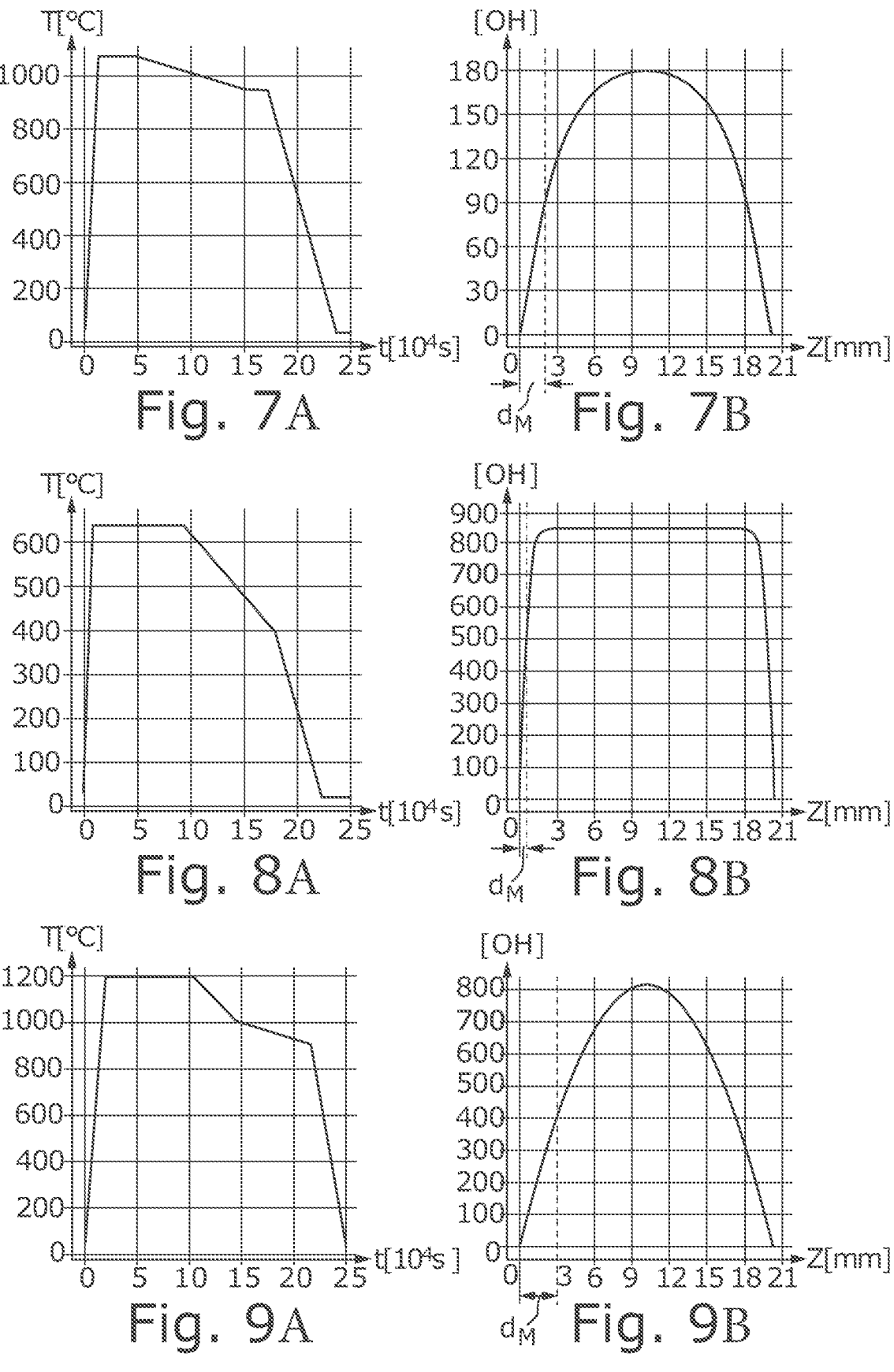

FIG. 7A shows an example of the temperature progression in a tempering process on a glass body composed of titanium-doped quartz glass as described in a working example of U.S. Pat. No. 10,732,519 B2, which can also be used in principle in the hot bonding operation described above for joining of the two part-bodies 26a,b. In the tempering process, the glass body is first heated up to a hold temperature of 1080° C. for 3 h and kept at the hold temperature for a hold time of 8 h, before controlled cooling at a cooling rate of 4 K/h to a temperature of 950° C. After the glass body has been kept at the temperature of 950° C. for 4 h, the glass body is cooled down to a temperature of 300° C. at a higher cooling rate of 50 K/h.

FIG. 7B shows the one-dimensional (simulated) progression of the OH content of a glass body (without cooling channels) that has a thickness of 2 mm in thickness direction (z direction) of the glass body after conclusion of the tempering process of FIG. 7A. For the simulation, a constant OH content of the glass body in thickness direction of 180 ppm by weight prior to commencement of the tempering process was assumed. In addition, it was assumed that the glass contains sufficient hydrogen, i.e. there is no exit barrier for OH groups. As apparent in FIG. 7B, the OH content (in ppm by weight) in the middle of the glass body (i.e. at Z=1 mm) even after the tempering process is still 180 ppm by weight. However, the OH content decreases to a value of 0 ppm by weight toward the edges of the glass body (at Z=0 cm and at Z=2 mm). The reduction in the OH content at the edges of the glass body is attributable to the diffusion of OH groups out of the quartz glass.

For the simulation, it was assumed that the tempering process takes place in a furnace in which the environment of the glass body has a water vapor pressure that tends to zero since the furnace is operated with a vacuum, air or inert gas with adequate circulation. For the simulation, the diffusion coefficients used as a function of the temperature were those stated in the article "Brückner I" cited above or in the article "Brückner II" cited above; cf., in particular, FIG. 36 in the latter article. The quartz glasses referred to as type II in FIG. 36 of the article "Brückner II" are quartz glasses that have been melted from pulverulent silicon dioxide under a hydrogen-oxygen gas flame. The OH content of such quartz glasses is comparable to that of a quartz glass produced in a soot process and somewhat lower than the OH content of directly deposited quartz glass, which is the reason why the values described in the article "Brückner II" can be used for the simulation. The diffusion of OH groups out of Ti-doped quartz glass proceeds by way of approximation with the same temperature-dependent diffusion constants as in the case of undoped quartz glass, and so the diffusion constants of undoped quartz glass can also be employed for titanium-doped quartz glass.

The distance from the edge of the glass body at which the OH content decreases to 50% of the maximum value is identified as du in FIG. 7A and forms a guide value for the thickness of a depletion zone or depletion region of the quartz glass. In the example shown in FIG. 7B, the maximum value of the OH content is 180 ppm by weight and the value of the thickness du is about 220 μm.

The thickness $d_M$ of the depletion zone depends not only on the maximum OH content of the quartz glass but also on the tempering process, especially on the value of the hold temperature and the hold time. In the case of a higher hold temperature, the thickness du of the depletion zone increases, as described hereinafter with reference to FIGS. 8A and 8B and FIGS. 9A and 9B.

FIG. 8A shows the temperature progression in a tempering process in which the hold temperature is 650° C. and the hold time is 24 h. FIG. 8B shows the simulated progression of the OH content, which declines from a maximum OH content of 850 ppm by weight in the middle of the glass body to 0 ppm by weight at the edge of the glass body. Again, it was assumed that the prerequisites for an exit barrier for OH groups do not exist. The OH content in the middle of the glass body corresponds to the constant initial value over the thickness of the glass body that was fixed for the simulation. The thickness $d_M$ of the depletion zone in this example is only 48 μm.

FIG. 9A shows the temperature progression in a tempering process in which the hold temperature is 1200° C. and the hold time is 24 h. In this case too, it was assumed that the prerequisites for an exit barrier for OH groups do not exist. FIG. 9B shows the simulated progression of the OH content, which declines from a maximum OH content of about 800 ppm by weight in the middle of the glass body to 0 ppm by weight at the edge of the glass body. The thickness $d_M$ of the depletion zone in this example is 290 μm. In the progression of the OH content shown in FIG. 9B too, as in the example of the simulation described in FIGS. 8A and 8B, a constant value of the OH content of 850 ppm by weight over the thickness of the glass body was assumed. After the performance of the tempering process shown in FIG. 9A, OH depletion thus also took place in the middle of the glass body.

In the hot bonding process described above too, in which the two part-bodies 26a,b were bonded to one another along the bonding face 27, OH depletion of the quartz glass takes place. FIG. 2A shows, by way of example, a depletion region 28 on the outside or on the outer edge of the glass body 24, which in particular runs along a top side 29a of the glass body and on a bottom side 29b of the glass body 24. As likewise apparent in FIG. 2A, there also exists a depletion region 30 in the material of the glass body 24 that adjoins the cooling channels 25. In the glass body 24 shown in FIG. 2B, there exists a further depletion region 30' that extends along the bonding face 27 between the cooling channels 25, since the two part-bodies 26a,b have been heated separately. The depletion regions 28, 30, 30' on the glass body 24 are shown in excessive breadth or thickness in FIGS. 2A and 2B.

Figures 3A, 3B:
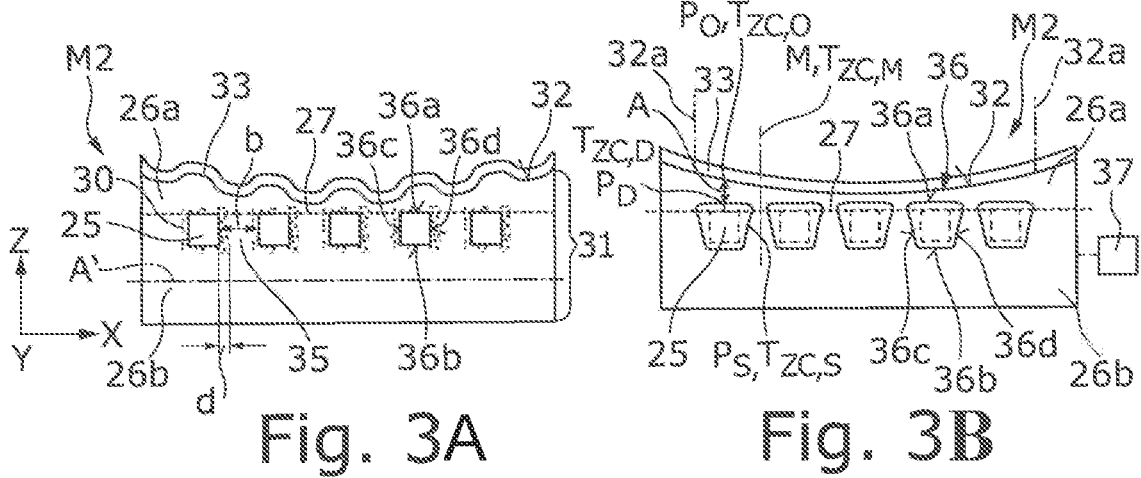

FIG. 3A shows a mirror M2 with a substrate 31 that has been produced from the glass body 24 shown in FIG. 2A. In the production of the substrate 31, the glass body 24 was processed by grinding in order to remove the depletion region 28 on the top side 29a and on the bottom side 29b of the glass body 24. In addition, the glass body 24 was trimmed at the edges in the production of the substrate 31. In the grinding and a subsequent polishing step, a surface 32 is formed on the top side 29a of the substrate 31, and a reflective coating 33 is applied thereto after the grinding and a subsequent polishing step. In the example shown, in which the mirror M2 is an EUV mirror, the reflective coating 33 is designed to reflect EUV radiation at an operational wavelength in the EUV wavelength range between around 5 nm and around 30 nm, and for that purpose has a plurality of alternating layers of a material of high refractive index and a material of low refractive index. In the present example at an operational wavelength of 13.5 nm, the materials of the alternating layers of the reflective coating 33 are Si and Mo. The EUV radiation hits the reflective coating 33 only in part of the region, which is also referred to as optically utilized region 32a, and the outer edge of which is indicated by dashed-and-dotted lines in FIG. 3B. The area of the optically utilized region 32a may in some cases be much smaller than the area covered by the reflective coating 33. The optically utilized region 32a makes it possible to utilize the imaging light that passes through the projection system 10 for a further use after reflection at the mirror M2.

In the example shown in FIGS. 3A and 3B, the depletion regions 30 at the respective cooling channels 25 remain in the substrate 31. The OH gradient in the depletion regions 30 around a respective cooling channel 25 leads to a change in the zero crossing temperature of the coefficient of thermal expansion of the titanium-doped quartz glass. The gradient of the zero crossing temperature at a given temperature leads either to circumferential compressive stresses or to circumferential tensile stresses in the depletion region 30 adjoining the cooling channels 25.

In the example shown in FIG. 3A, it was assumed that there are compressive stresses that firstly cause an expansion of the quartz glass material which is not troublesome to any greater degree (not shown in the image) into the respective cooling channel 25, and secondly a curvature of the surface 32 to which the reflective coating 33 is applied above the respective cooling channels 25, which is shown in exaggerated form in FIG. 3A. In the production of the mirror M2, the surface 32 is polished, but the smoothing or polishing is effected at room temperature and not at the operating temperature of the mirror. Therefore, complete removal of the bulges shown in FIG. 3A is impossible, and so these lead to image defects in the operation of the mirror M2 at an operating temperature other than room temperature. The extent of the effects on image defects of the mirror M2 increase with the difference between room temperature and the operating temperature.

In order to avoid the bulges or general deformation at the surface 32 of the mirror M2, as shown in FIG. 3A, which is attributable to OH depletion of the glass material of the substrate 31 on hot bonding, it is favorable when the substrate 31 in the volume region adjoining the cooling channels 25 has a minimum gradient in the OH content or zero crossing temperature both in lateral direction (X direction) and in thickness direction (Z direction).

As apparent in FIGS. 3A and 3B, two adjacent cooling channels 25 are separated from one another by a land 35. A respective cooling channel 25 in the example shown has a rectangular cross section with a channel wall 36 having four wall sections 36a-d: an upper wall section 36a that forms the roof of the cooling channel 25 and is arranged adjacent to the surface 32 to which the reflective coating 33 is applied, a lower wall section 36b that forms the base of the cooling channel 25 and is remote from the surface 32 having the reflective coating 33, and two lateral wall sections 36c,d that adjoin the upper wall section 36a and the lower wall section 36b.

FIG. 3B shows a position $P_S$ in the middle (in Z direction) of the right-hand wall section 36d and a position $P_D$ in the middle (in X direction) of the upper wall section 36a. In the example shown in FIG. 3B, along the channel wall 36 shown in FIG. 3A, material was removed over the entire thickness d of the depletion region 30. At the middle position $P_S$ in the lateral wall section 36d of a respective cooling channel 25 that adjoins the adjacent land 35, the zero crossing temperature $T_{ZC,S}$ of the substrate 31, because of the removal of material, differs by less than 1.0 K from a zero crossing temperature $T_{ZC,M}$ in the middle M of the land 35. The comparison between the two zero crossing temperatures $T_{ZC,S}$, $T_{ZC,M}$ is made here at the level of the middle position $P_S$ of the lateral wall section 36d. In the example shown in FIG. 3B, in which the whole depletion region 30 has been removed, the above condition is met not just at the position $P_S$ in the middle of the lateral wall section 36d, but along the entire lateral wall section 36d.

If, unlike what is shown in FIG. 3B, not the whole of the depletion region 30 is removed, the zero crossing temperature $T_{ZC,S}$ on the lateral wall section 36d may possibly also have greater difference from the zero crossing temperature $T_{ZC,M}$ in the middle M of the land 35 of less than 3.0 K or less than 2.0 K. The sign of the difference $T_{ZC,M}$–$T_{ZC,S}$ depends on the temperature program; in general, however, a smaller OH content leads to a reduction in the zero crossing temperature.

In order to meet the above condition on the zero crossing temperatures $T_{ZC,S}$, $T_{ZC,M}$, it is generally necessary for the OH content of the substrate 31 at position $P_S$ in the middle of the lateral wall section 36d or along the entire lateral wall section 36d to differ by not more than 60 ppm by weight, by not more than 30 ppm by weight or by not more than 20 ppm by weight from the OH content at a middle M of the respective land 35, which can likewise be achieved by the removal of material described above.

As well as the lateral gradient in the OH content, the gradient in the OH content in thickness direction Z of the substrate 31 also affects the zero crossing temperature and hence the deformation of the surface 32 to which the reflective coating 33 is applied. In the example shown in FIG. 3B, at position $P_D$ in the middle of the upper wall section 36a, the substrate 31 has a zero crossing temperature $T_{ZC,D}$ that differs by less than 1.0 K from a zero crossing temperature $T_{ZC,O}$ at a position $P_O$ on the surface 32 at a distance A from the position $P_D$ in the middle of the upper wall section 36a. The distance A is measured here in thickness direction Z proceeding from the position $P_D$ in the middle of the upper wall section 36a, i.e. position $P_O$ at the surface 32 is immediately above position $P_D$ in Z direction. Because of the complete removal of the depletion region 30, the above condition on the zero crossing temperatures $T_{ZC,D}$, $Z_{ZC,O}$ at all positions along the upper wall section 36a is met.

As described in connection with the lateral gradient of the zero crossing temperature, if not the whole of the depletion region 30 is removed, the zero crossing temperature $T_{ZC,D}$ in the upper wall section 36a may also have a greater difference from the zero crossing temperature $T_{ZC,O}$ at the surface 32 above the channel wall 36 of less than 3.0 K or less than 2.0 K.

In order to meet the above condition on the zero crossing temperatures $T_{ZC,D}$, $T_{ZC,O}$, it is generally necessary for the OH content of the substrate 31 at the position $P_D$ in the middle of the upper wall section 36a or along the entire upper wall section 36a to differ by not more than 60 ppm by weight, by not more than 30 ppm by weight or by not more than 20 ppm by weight from the OH content at position $P_O$ on the surface 32, which is at the distance A in thickness direction Z above the position $P_D$ in the middle of the upper wall section 36a of the cooling channel 25, which can be achieved by the removal of material.

A condition on the zero crossing temperature or on the OH content met by the upper wall section 36a of the channel wall 36 generally does not have to be observed on the lower wall section 36b of the channel wall 36 since the lower wall section 36b does not curve into the interior of the respective cooling channel 25 and therefore does not lead directly to deformation at the surface 32 to which the reflective coating 33 is applied. Moreover, the increase in temperature resulting from the input of heat on irradiation of the mirror M2 on the surface 32 thereof in the lower wall section 36b of the channel wall 36 of a respective cooling channel 25 is comparatively small.

On operation of the mirror M2 or heating of the mirror M2 to its operating temperature, in the case of compliance with the above-described conditions, the surface 32 of the mirror M2 is deformed only slightly, if at all. In order to cool the mirror M2 during operation, a cooling fluid, for example cooling water, can flow through the cooling channels 25 with the aid of a cooling device 37 indicated in FIG. 3B. For this purpose, the cooling device 37 may have, for example, a pump or the like.

Because of the removal of material from the channel wall 36 shown in FIG. 3A, the substrate 31 has a non-zero OH content along the entire channel wall 36 shown in FIG. 3B. Depending on the depth over which material is removed, the OH content at the channel wall 36 may be greater than 60 ppm by weight, greater than 120 ppm by weight or possibly much greater. The depth over which material is to be removed from the channel wall 36 depends upon factors including the maximum and average OH content in the substrate 31. If the glass is one produced by direct deposition, this will typically have a comparatively high maximum OH content of about 850 ppm by weight: cf., for example, FIG. 8B and FIG. 9B. Since the OH content drops down to 0 ppm by weight on outward diffusion, greater removal will generally be required in this case than for a glass that has been produced in a soot process and where the maximum and average OH content are in the order of magnitude of about 200 ppm by weight.

Since, depending on the nature of the material-removing method, the removal takes a comparatively long time and incurs correspondingly high costs, and there is the problem of Jack of contour accuracy in the removal, it can be difficult to remove the entire depletion region 30. The depletion region 30, defined in the present case as that region adjoining the channel wall 36 in which the OH content of the substrate 31 is at least 5 ppm by weight lower than the OH content in the middle M of the adjoining land 35 and/or lower than the OH content at the surface 32, should therefore have a minimum thickness d. In particular, the thickness d—optionally after the removal of material described above—should be less than 50 µm, less than 30 µm or less than 1 µm.

There are various options for the removal of material from the channel wall 36. For example, the channel wall 36, after the hot bonding, can be treated with an abrasive emulsion or an etch solution. If a depletion region 30 having a thickness of more than 1 mm is to be removed, it is favorable to use hot phosphoric acid for the removal. The etching action can also be spatially controlled with the aid of prior damage to the glass material, for example using a short-pulse laser or via ultrasound treatment. There may be preferential removal here in the upper wall section 36a and in the upper region of the lateral wall sections 36c,d, as indicated in FIG. 3B. Especially in combination with the preliminary damage, it is also possible to use alkalis as etchant. In general, it is favorable when a slow etchant, for example phosphoric acid or alkali, is used, since it is possible to work at a low etch rate with low flow rates, which enables homogeneous etching removal.

As described hereinafter with reference to FIGS. 4A-4D, the diffusion of OH groups out of the glass material of the substrate 31 or out of the two portions 26a,b and hence the occurrence of an OH gradient during the hot bonding can be prevented via the (possibly temporary) application of a protective coating 38 to the channel wall 36. For this purpose, the protective coating 38 contains at least one material that prevents the outward diffusion of OH groups. For this purpose, the protective coating 38 typically includes at least one metal layer since any kind of metal layer greatly inhibits outward OH diffusion. Suitable metals should have a melting point above the highest process temperature in the hot bonding operation. In the example shown, the protective coating 38 is a chromium coating. Chromium, as well as a high melting point, has the advantage of having good applicability and structurability.

The metal surface of the protective coating 38 of the cooling channels 25 can be protected in the hot bonding process by conducting the process in inert gas or under reduced pressure. Alternatively, it is possible to select a metal having a sufficiently stable oxide layer at the temperatures used, or to coat the metallic protective coating 38 with other oxidic or nonmetallic protective layers. It is also possible to use a sequence of different metals, metals and semimetals, or metals and oxides in order to achieve a stronger barrier effect. A standard MoSi multilayer as used to render EUV optical systems reflective has a virtually infinite barrier action for hydrogen. However, molybdenum, because of its low melting temperature, is suitable for only relatively cold bonding processes, or it is necessary to apply further protective layers to the Mo—Si multilayer.

Figures 4A, 4B:
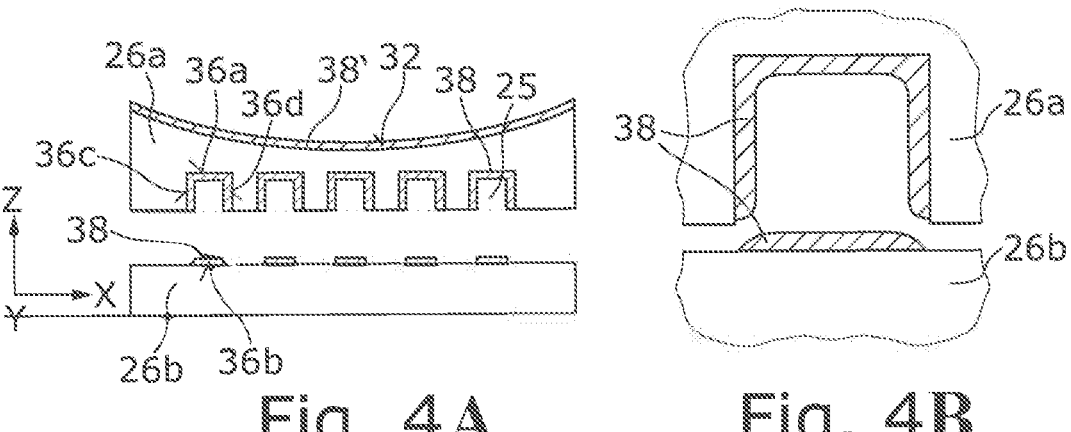

Ideally, the channel wall 36 is coated with the metallic protective coating 38 over the entire channel circumference and possibly also the later mirror area 32, as shown in FIG. 4A. It is also possible to provide all surfaces of the glass body 24, or of the two part-bodies 26a,b, that have been exposed to the surrounding atmosphere during the hot bonding with the protective coating 38, or to metallize them. Possible methods for metallization include those with sputtering application, initial deposition from the gas phase or from a liquid after initial etching. As soon as what is called a primer layer has been applied, a thicker layer of another metal as well can be applied electrolytically.

In the example shown in FIG. 4A, the cooling channels 25 or the corresponding depressions have been worked into the first part-body 26a. The first part-body 26a in this case is coated with the protective coating 38 at least on its surface that forms the later bonding face 27, over its full area and including the still-open cooling channels 25. A grinding or polishing step removes the metal layer at the later bonding face 27, so as to leave open cooling channels 25 that are coated on three sides in the first part-body 26a, i.e. in the upper wall section 36a and in the two lateral wall sections 36c,d. In the example shown in FIG. 4A, the later mirror surface 32 is also coated with a metallic protective coating 38', but this is not absolutely necessary.

The second part-body 26b may in principle remain uncoated, or is coated only in the region of the lower wall sections 36b of the later cooling channels 25, as shown in FIG. 4A. The coating of the second part-body 26b in the lower wall sections 36b can be effected by complete metallization and masked etching of the later bonding face 27, or by application of a mask and selective coating. The metallized regions here must generally be made somewhat narrower than the cooling channels 25 since, especially in a hot bonding process with contact bonding, perfect positioning of the first part-body 26a on the second part-body 26b is impossible. Thus, the lower wall section 26d of a respective cooling channel 25 remains uncoated either in its entirety or along its lateral edges. The resulting depletion zones extend into the substrate 31 and thus have a much lesser effect on the deformation of the mirror surface 32 as a function of temperature than depletion zones 30 in the upper wall section 36a of the cooling channels 31.

The optionally masked or differently structured protective coating 38 that has been applied prior to the hot bonding may be made quite thin and may serve merely as primer for further galvanization or chemical deposition from solution after the hot bonding. This results in growth of the protective coating 38 in terms of thickness, but also laterally along the coated surfaces. If the metallization in the region of the portion that has not been provided with cooling channels 25, the second part-body 26b in the example shown, is only a few tens of micrometers narrower than the width of the cooling channel 25, this lateral growth may be sufficient to close the gaps and to cover the cooling channel 25 with the protective coating 38 over the entire channel circumference. Subsequent galvanization or chemical deposition can also contribute to closing gaps in the metallization that may arise on account of the residual roughness of the channel wall 36 of the cooling channels 25.

In order to suppress outward hydrogen diffusion, depending on the metal used, freedom from cracks, layer structure (columnar, amorphous, granular) and process temperature and duration, a protective coating 38 having a few layers of atoms may be sufficient. A protective coating 38 should not be unnecessarily thick either since the different coefficient of thermal expansion of the protective coating 38 from the glass will then result in unnecessarily high introduction of stresses into the glass during the tempering. Specifically in the case of rough glass surfaces or slots from the masking process, however, a final layer thickness of the protective coating 38 in the micrometer range may be necessary to achieve imperviosity. However, thinner layers, by means of high-temperature ion beam processes or glass bead jetting, can be pushed into valleys or corners/gaps in a controlled manner in order to be able to work with a thinner protective coating 38 overall.

At bonding temperatures of >1200° C., it is also possible to make the metallized strip of the protective coating 38 on the second part-body 26*b* somewhat broader than the coated cooling channel 25 in the first part-body 26*a*, especially when the flanks of the metallization run relatively obliquely, as shown in FIG. 4B. In this case, the flanks of the metallization or of the protective layer 38 result in a residual gap between the first part-body 26*a* and the second part-body 26*b*. At the high temperatures, and optionally assisted by an additional contact pressure, the first part-body 26*a* in this case adapts between the metallizations on the second part-body 26*b*. After the hot bonding, remaining residues of metal should be etched away from the edges of the cooling channels 25 since they have a significantly different coefficient of thermal expansion from the glass material of the substrate 31 that encloses them on three sides. The remaining notch in the glass should be rounded by suitable working with a rotating tool on a flexible shaft, purging with an abrasive emulsion or etching. In order to improve the flow characteristics, it may additionally be filled with a permanently elastic substance, or an organic inliner may be used. The method with seamless metallization can of course also be used when the cooling channels 25 are worked not into the first part-body 26*a* but into the second part-body 26*b*.

Figures 4C, 4D, 5A, 5B, 5C, 6:
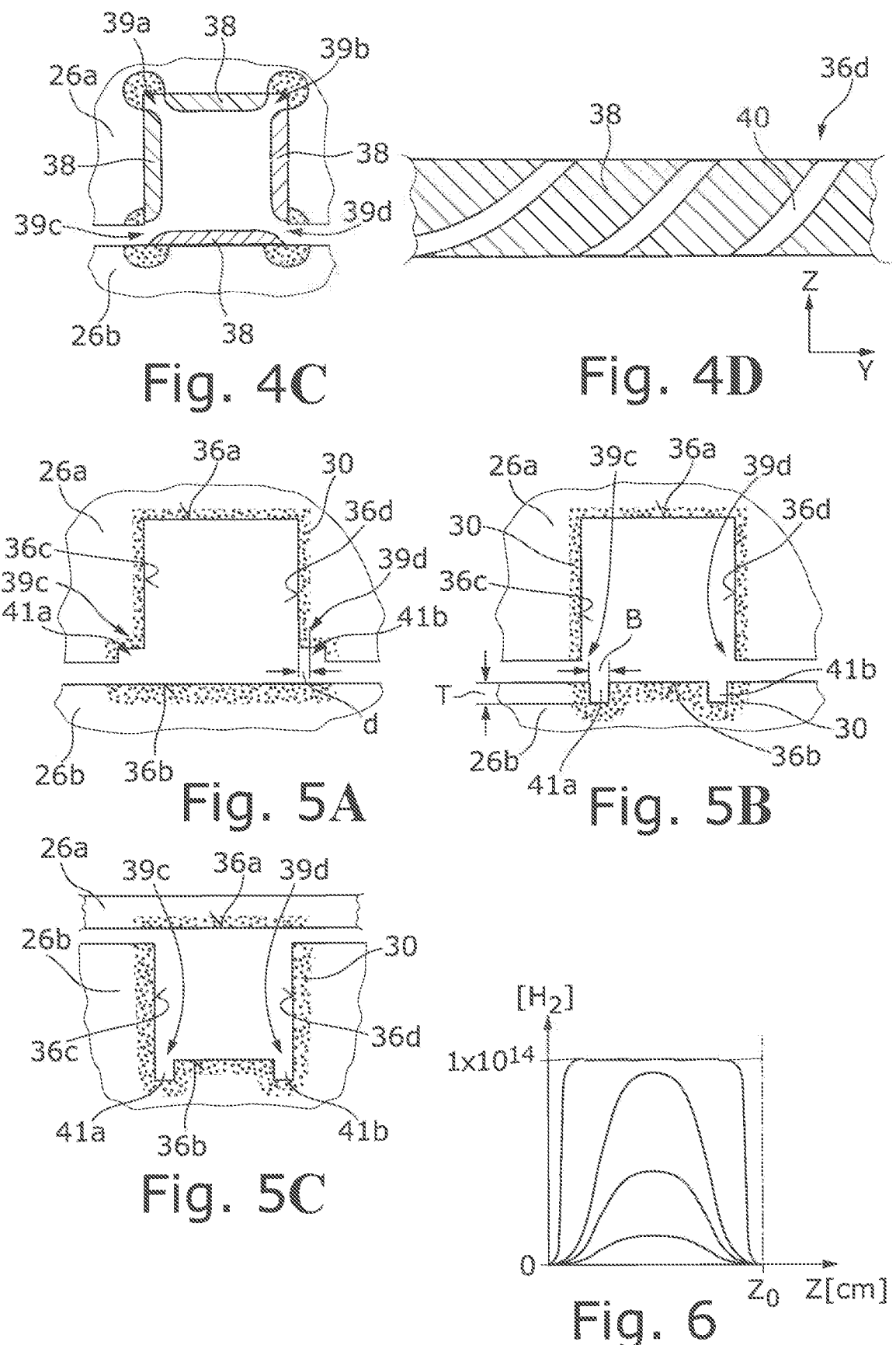

It may be advantageous when the metallic protective coating 38 has defined interruptions (slots), since the metallic material of the protective coating 38 has a different coefficient of thermal expansion than the glass and therefore has the effect during tempering that stresses are introduced and frozen into the surrounding glass and are only partly alleviated on removal of the metallic protective layer 38. FIG. 4C shows an example in which the channel wall 36 is not covered by the protective coating 38 in four corner regions 39*a-d* that are each disposed between two adjacent wall sections 36*a-d* of the channel wall 36, meaning that the channel wall 36 is covered by the protective coating 38 only outside the corner regions 39*a-d*, and the corner regions 39*a-d* are hollowed out. As indicated in FIG. 4C, this results in local OH depletion in the corner regions 39*a-d*. But since the corner regions 39*a-d* are insulated, it is possible, unlike in the case of the annular or tubular depletion region shown in FIG. 3A, for only a much smaller temperature-dependent force to be built up that would lead to bulges of the glass above the cooling channels 25.

FIG. 4D shows a further example of a protective coating 38 that runs along a lateral wall section 36*d* of the cooling channel 25, in a top view in longitudinal direction Y of the cooling channel 25. As apparent in FIG. 4D, the protective coating 38 has oblique slots 40 where the lateral wall section 36*d* is not covered by the protective coating 38, in order to reduce the force acting in longitudinal direction Y of the cooling channel 25. It will be apparent that the slots 40 can also be continued in the form of a helix or the like over all four wall sections 36*a-d* of the cooling channel 25.

After contact bonding of hydrophilic glass surfaces, one or more monolayers of water that remain on the joining face hinder the desired formation of covalent bonds in the bonding operation. Typically, the water molecules can diffuse out along the bonding face 27 in the course of heating.

If, however, a continuous metallization has been created prior to the bonding operation, including the open sides of the bonding face 27, this outward diffusion is suppressed, and all that remains is the very gradual diffusion of water into the glass body 24. It may be advantageous to bake the two contact-bonded part-bodies 26*a,b* that have not yet been metallized, or not yet been seamlessly metallized, at 100° C. to 400° C. for a few hours to a few weeks in order to drive out the water from the gap. Only thereafter are the insides of the channel metallized, and a masked partial metallization thickened, including the closing of the cutouts in the metallic protective coating 38.

In the examples described above, it has been assumed that the cooling channels 25, or the cross section thereof, have been introduced completely into the first part-body 26*a* or into the second part-body 26*b*. It will be appreciated that the cooling channels 25 may also be introduced into both part-bodies 26*a,b*. If the cross section of the cooling channel 25 in this case is composed of a milled cutout in the first part-body 26*a* and a milled cutout in the second part-body 26*b*, the simplest way is to apply a largely continuous metallic protective coating 38 both to the first part-body 26*a* and to the second part-body 26*b*, and only then to polish the regions of the surfaces of the two part-bodies 26*a,b* that are to be bonded. In this case, there remains a metal-free bonding face 27, and cooling channels 25 having all-round coating up to close to the bonding site. The minimal uncoated region at the sides of the channels adjoining the bonding site, which arises as a result of edge rounding or the application of chamfers, is usually not a matter of concern with regard to the effect on the coefficient of thermal expansion, since it is locally very limited. Moreover, it specifically permits the diffusion of water out of the gap.

If the protective coating 38 is disruptive, for example because of its effect on the coefficient of thermal expansion of the glass, it can be removed again after the hot bonding process by etching or electrolysis.

A further means of preventing the diffusion of OH groups out of the quartz glass is to fill the cooling channels with a glass powder that has the same or a higher OH content than the substrate glass during the hot bonding. If the fill level of the cooling channels is above 10%, Ti-doped quartz glass having approximately the same concentration as in the substrate should be used for this purpose, or the Ti content should be adjusted such that the glass powder has lower expansion than the substrate.

A further means of reducing image defects in the optical element M2, in which it may be possible to dispense with removal of material or the application of a protective coating 38, is described hereinafter in association with FIGS. 5A-SC, which show the first and second part-bodies 26*a,b* prior to the joining. In the example shown in FIG. 5A the channel wall 36 on the first part-body 26*a*, and in the examples shown in FIGS. 5B and SC the channel wall 36 on the second part-body 26*b*, has two slot-shaped depressions 41*a,b*. Likewise indicated in FIGS. 5A-5C is the depletion region 30 adjoining the channel wall 36, which is formed after the hot bonding of the two part-bodies 26*a,b*, and the thickness d of which in the example shown is about 100 μm. As apparent in FIGS. 5A-5C, the depletion region 30 which is formed during the hot bonding spreads around the slot-shaped depressions 41*a,b*. The annular depletion region 30 along the cross section of the respective cooling channel 25 is attenuated by the slot-shaped depressions 41*a,b*, so as to result in a reduction in temperature-related bulging or recessing of the surface 32 above the cooling channels 25, which leads to a reduction in image defects in the operation of the optical element M2.

In order to achieve this, the slot-shaped depressions 41*a,b* should have a depth T corresponding at least to the thickness d of the depletion region 30. It is favorable when the depth T corresponds to at least twice the thickness d of the depletion region 30, i.e. about 200 μm in the example shown, but the depth T should generally not be greater than five times the thickness d of the depletion region 30. The width B of the respective slot-shaped depression 41*a,b* should be in the order of magnitude of about 100 μm or higher.

In all three examples shown in FIGS. 5A-5C, the slot-shaped depressions 41*a,b* are formed in the two corner regions 39*c*, 39*d* between a respective lateral wall section 36*c*, 36*d* and the lower wall section 36*b*. In the example shown in FIG. 5A, the slot-shaped depressions 41*a,b* have been ground into the upper part-body 26*a* in which, in this example, the cross section of the cooling channel 25 runs. In the example shown in FIG. 5B, the two slot-shaped depressions 41*a,b* have been ground into the otherwise planar surface of the second, lower part-body 26*b*. In the example shown in FIG. 5C, the cross section of the cooling channel 25 is in the second, lower part-body 26*b*, and the slot-shaped depressions 41*a,b* run from the lower wall section 36*b* downward (in Z direction). Lateral broadening of the cooling channel 25 in the region of the later bonding face 27, as shown in association with FIG. 5A, is optionally likewise possible in the example shown in FIG. 5C, even though the discontinuity in this case is disposed close to the surface 32 of the optical element M2.

It will be apparent that the slot-shaped depressions 41*a,b* may also be disposed elsewhere along the channel wall 36, for example in the middle of the lateral wall sections 36*c,d*. It is also possible for the slot-shaped depressions 41*a,b*, similarly to the slots 40 described in association with FIGS. 4A-4C, to be introduced into the respective cooling channel 25 in helical form or obliquely in sections. If the slot-shaped depressions 41*a,b* should be troublesome in the passage of a cooling medium through the cooling channels 25, these may, for example, be smeared or closed with a soft organic mass, or an inliner or hose may be introduced into the respective cooling channel 25.

A further way of creating a minimum gradient in the OH content of the titanium-doped quartz glass in the case of the hot bonding process described above is for the substrate 31 of the optical element M2 to have a low maximum OH content. The effect of the deformation of the surface 32 covered with the reflective coating 33 which is shown in FIG. 3A can typically be avoided when the substrate 31, but at least the upper part-body 26*a*, has a maximum OH content of less than 10 ppm by weight.

In order to achieve this, the OH content of the quartz glass of the main body 24 can be reduced by a suitable thermal drying operation or a chemical drying operation (for example by means of halogens) prior to the sintering in the production of the main body 24 in a soot process. Such a drying operation enables production of quartz glasses having an OH content of less than 1 ppm by weight, as known for applications in the IR or DUV wavelength range. In the same way, it is also possible to produce extremely dry titanium-doped quartz glass as required for the substrate 31 described here for the EUV mirror M2. Since dry glasses are difficult to form and homogenize, one option is to conduct the homogenizing of the Ti content at the early stage of the soot powder and then to press a gray body from the homogenized powder, from which the substrate 31 is formed by sintering or in an HIP (hot isostatic pressing) process.

A very dry quartz glass formed in this way has the feature of a high fictive temperature and hence a high slope in the coefficient of thermal expansion of the quartz glass in the order of magnitude of more than 1.8 ppb/K$^2$ at 20° C. For that reason, a low OH content of less than 10 ppm by weight can be shown even without a direct measurement by the thermal data of the quartz glass or of the substrate 31. The dried quartz glass of the substrate 31 is generally also free of hydrogen, but could also be laden with hydrogen without this leading to an elevated OH gradient.

The drying described above can be effected collectively on the two portions 26*a,b* of the glass body 24, but it is also possible to conduct the drying individually on each of the two part-bodies 26*a,b*. It may be sufficient to dry only the upper part-body 26*a* and additionally the upper few millimeters of the lower part-body 26*b*. For that purpose, a respective part-body 26*a*, 26*b* individually or the two part-bodies 26*a,b* together may be tempered at temperatures above 1400° C., preferably above 1600° C., for several days or weeks. At temperatures above about 1450° C., there will be significant deformation of the quartz glass, and so the drying should be performed in a crucible open at the top or in a mold open at the top.

A further means of reducing the OH gradient in the glass which is caused by the hot tempering is to use hydrogen-free or low-hydrogen glass for the production of the substrate 31. Since standard EUV glasses contain hydrogen as a result of the manufacture, this can be diffused out of the glass in a controlled manner before or optionally during the hot bonding.

FIG. 6 shows, by way of example for a glass block or glass blank having a thickness $Z_0$, several distributions of the $H_2$ concentration that form in the course of tempering, assuming that the glass block initially has a constant value of $1 \times 10^{14}$ molecules/cm$^2$. In the course of tempering, depletion zones are initially formed at the lateral edges of the glass block with a concentration of 0 molecules/cm$^2$ directly at the surface and with an approximately linear rise in the inward direction and a plateau in the middle region. During the tempering, the plateau will gradually shrink, and only when a true turning point is reached will the concentration also fall in the middle of the glass block, which results in an appreciably smaller $H_2$ concentration in the middle. The flow of hydrogen that diffuses out via the surfaces decreases only slightly as the size of the plateau decreases, since the concentration gradient from the concentration in the middle up to the concentration at the edge remains the same. Therefore, in order to reduce the flow of hydrogen diffusing out during the hot bonding, the aim is also to lower the hydrogen concentration in the middle of the glass block during the tempering, for example to $\frac{1}{10}$ of the initial content.

The different temperature dependence of H2 and OH diffusion can also be exploited in that the hydrogen concentration is lowered, for example at 400° C., while the majority of outward OH diffusion takes place in the hold step of the bonding, for example at 1050° C. Relative to the diffusion rate of the OH groups, the H2 profile is then subcooled, meaning that the high H2 concentrations further to the inside do not arrive quickly enough to supply the dissociation of OH groups with hydrogen. In that case, it is not absolutely necessary to lower the $H_2$ concentration within the glass if an Hz depletion zone having a width of several mm or a few cm can be created in particular in the region of the cooling channels 25.

The tempering can be effected on the typically cylindrical raw glass body before separation into the two part-bodies 26a,b, on the separate but still unstructured part-bodies 26a,b (i.e. without introduction of depressions), on the structured part-bodies 26a,b, or on the two part-bodies 26a,b in the already contact-bonded state (cf. also FIG. 2B). The tempering in the contact-bonded state at 200-400° C., according to the article "Wafer direct bonding: tailoring adhesion between brittle materials", A. Plößl, G. Kräuter, Materials Science and Engineering, R25 (1999) 1-88, has the benefit that water simultaneously diffuses out along the bonding face 27, which results in improved bond strength, less movement in the course of heating for hot bonding, and a reduced lateral OH gradient along the bond.

If, as set out above, the outward diffusion of hydrogen during the hot bonding should be permitted, the tempering process should be performed under reduced pressure or with significant purging with air or inert gas, in order to prevent accumulation of hydrogen in the cooling channels 25.

In the example described here, it has been found to be favorable when the second part-body 26b, at a distance A' shown in FIG. 3A from the lower wall section 36b of the cooling channel 25 which corresponds at least to a land width b and preferably to not more than ten times a land width b of a respective land 25 and/or which corresponds at least to the thickness D of the first part-body 26a and to not more than ten times the thickness D of the first part-body 26a between the upper channel wall section 36a and the surface 32, has a hydrogen content which is not more than 50% of the average hydrogen content of the second part-body 26b. The land width b is typically in the order of magnitude of a few millimeters.

A further means of reducing the OH gradient in the titanium-doped quartz glass of the glass body 24 or the substrate 31 is to suppress the outward diffusion of OH groups during the hot bonding in that the hot bonding is conducted at least partly in saturated water vapor, in water or in an oxidizing atmosphere, and/or in that an aftertreatment in a tempering process that follows the hot bonding results in diffusion of OH groups into the titanium-doped quartz glass of the glass body 24.

Figures 10A, 10B, 11A, 11B:
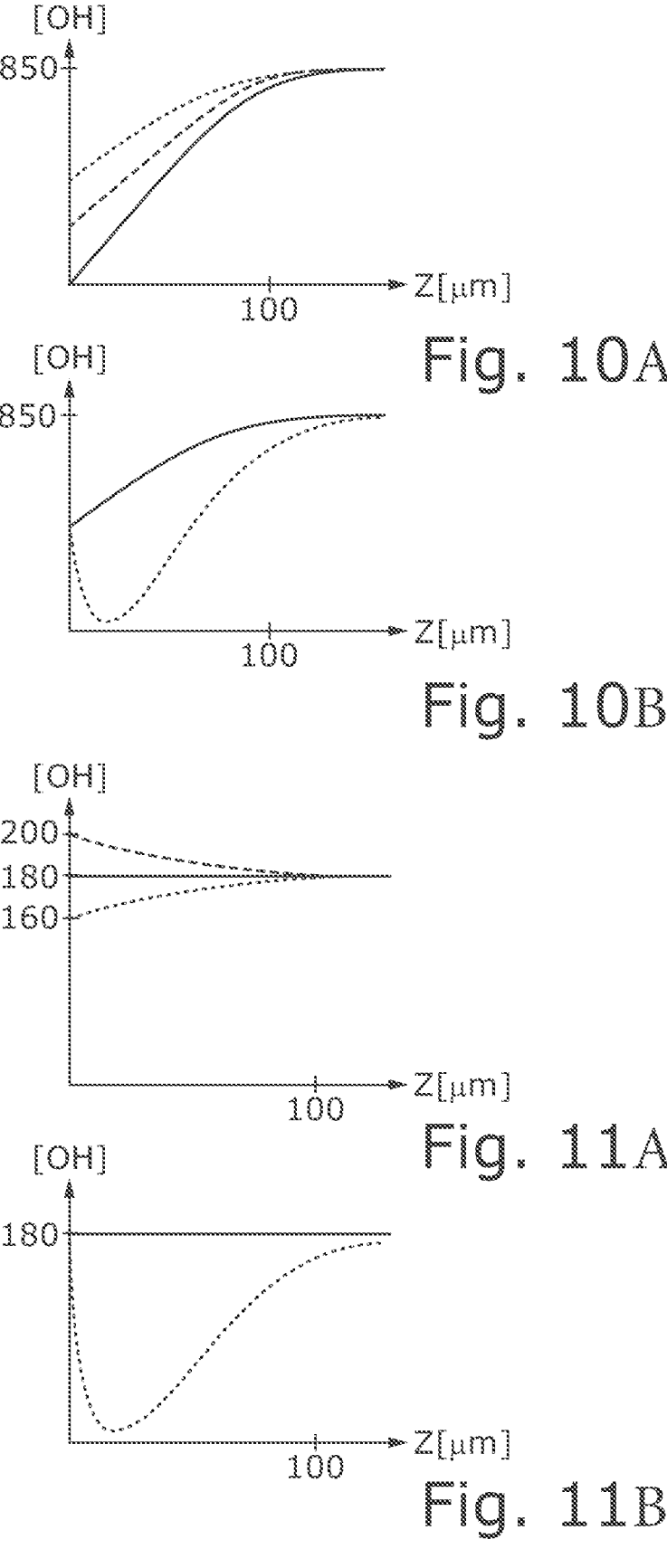

FIG. 10A shows, by way of example, the progression of the OH content in a quartz glass produced by direct deposition and having an average OH content of about 850 ppm by weight after a hot bonding process with at a hold temperature of 650° C. and a hold time of 24 h in thickness direction Z in the immediate proximity of its surface. The average OH content is in principle the maximum OH content of the quartz glass, since the thickness of the region in which there is a lower or greater OH content than the maximum OH content for diffusion-related reasons is so small since the contribution of this region in the forming of the average over the total volume of the glass body is virtually negligible. The solid curve shows the OH content on hot bonding in an inert gas-purged furnace; the dashed curve and dotted curve show the OH content on hot bonding in a furnace containing water vapor at a partial pressure of much lower than 100%. A partial pressure of 25% was assumed for the dashed curve, and a ratio of 50% for the dotted curve. The dashed and especially the dotted progression of the OH content may be tolerable, and so there is no need for the removal of material from the channel wall 36 as described above, or the necessary removal can at least be reduced.

FIG. 10B shows the OH content in a glass body 24 composed of directly deposited quartz glass in which the OH content after the hot bonding is increased by an aftertreatment in the form of a heat treatment that follows the hot bonding. The initial result in the aftertreatment is the dashed curve shown in FIG. 10B, whereas the solid curve shown in FIG. 10B is achieved for long periods.

FIGS. 11A and 11B show diagrams analogous to FIGS. 10A and 10B for a glass body 24 composed of quartz glass deposited in a soot process and having an average OH content of about 180 ppm by weight. The solid curve of FIG. 11A shows the case of a perfectly adjusted partial pressure of water vapor during the hot bonding, at which the OH content at the edge of the glass body 24 and hence at the channel wall 36 virtually does not deviate from the average OH content of 180 ppm by weight. In FIG. 11A, the dashed curve describes the case that the partial pressure of water vapor chosen was too large, and the dotted curve represents the case that the partial pressure of water vapor chosen was too small. As apparent in FIG. 11A, the OH content at the edge of the glass body 24 and hence at the channel wall 36 in these cases too differs by not more than 10% (corresponding to ±18 ppm by weight) from the average OH content of the substrate 31 or the glass body 24. The point at which the deviation from the average OH content, as the case may be, is more than 10% depends on the bonding temperature and the bonding time.

FIG. 11B shows, as a dotted curve, the OH content of a completely dry bonded quartz glass body 24 shortly after the commencement of the aftertreatment and, as a solid curve, the OH content after a very long time and with ideally adjusted partial pressure of water vapor. As can be seen from the solid curve, the result in this case too is a distribution of the OH content which virtually does not deviate from the average OH content of about 180 ppm by weight.

For a quartz glass body 24 made of directly deposited quartz glass, the curves for the distribution of the OH content are analogous when partial pressures of water vapor of nearly 100% or corresponding to the solubility at the respective temperature are used.

In the hot bonding processes described in FIG. 10A and in FIG. 11A, it is generally advisable to commence the bonding process under dry conditions in order that surface water and any water of condensation can diffuse out of the glass body before the water vapor is added. Alternatively, for the reduction of outward diffusion, the hot bonding process can be conducted in water or in an oxidizing atmosphere.

In the examples described above, starting material was a glass body 24 in the form of titanium-doped quartz glass. However, the measures or findings described therein can also be applied or transferred to a glass body 24 made of undoped quartz glass, which is used in the case of reflective optical elements for other wavelength ranges, for example for the UV wavelength range. This is at least partly also applicable to a glass body 24 made of glass ceramics.

What is claimed is:

1. An optical element for reflecting radiation, comprising:
   a substrate formed from quartz glass or from a glass ceramic, and comprising a first part-body and a second part-body that are joined along a bonding face by hot bonding,
   a plurality of cooling channels that run within the substrate in a region of the bonding face and are separated from one another by lands, and
   a reflective coating applied to a surface of the first part-body,
   wherein
      a respective one of the cooling channels has a channel wall which, at at least one position adjoining a respective one of the lands, has a zero crossing temperature that deviates by less than 3.0 K from a zero crossing temperature at a middle of the land, and the channel wall, at the at least one position adjoining the land has, at the at least one position facing the surface an OH content of greater than 0 ppm by weight.

2. The optical element as claimed in claim 1, wherein the substrate is formed from titanium-doped quartz glass.

3. The optical element as claimed in claim 1, wherein the channel wall of the respective cooling channel has, over an entire lateral wall section that adjoins the respective land, a zero crossing temperature that deviates by less than 3.0 K from a zero crossing temperature at a middle of the land.

4. The optical element as claimed in claim 1, wherein the channel wall, has, over an entire upper wall section facing the surface, an OH content of greater than 0 ppm by weight.

5. The optical element as claimed in claim 1, wherein the channel wall at at least the one position facing the surface to which the reflective coating is applied has a zero crossing temperature that deviates by less than 3.0 K from a zero crossing temperature at the surface.

6. The optical element as claimed in claim 5, wherein the channel wall has, over an entire upper wall section facing the surface, a zero crossing temperature that deviates by less than 3.0 K, from a zero crossing temperature at the surface.

7. The optical element as claimed in claim 1, wherein an OH content at the channel wall deviates by less than 10% from an average OH content in a bulk of the substrate.

8. The optical element as claimed in claim 1, wherein the channel wall is covered at least partly by a metallic protective coating.

9. The optical element as claimed in claim 8, wherein the channel wall has a plurality of corner regions and the channel wall is covered by the protective coating only outside the corner regions.

10. The optical element as claimed in claim 8, wherein channel wall is not covered by the protective coating along slots that run at least partly in longitudinal direction of the cooling channel.

11. The optical element as claimed in claim 1, wherein the first part-body has a maximum OH content of less than 10 ppm by weight.

12. The optical element as claimed in claim 1, wherein the first part-body has a maximum hydrogen content of not more than $1 \times 10^{15}$ molecules/cm$^3$.

13. The optical element as claimed in claim 12, wherein the second part-body, at a distance from a lower wall section of the cooling channel which corresponds at least to a land width of a respective land and/or which corresponds at least to the thickness of the first part-body and to not more than ten times the thickness of the first part-body between the upper channel wall section and the surface, has a hydrogen content which is not more than 50% of the average hydrogen content of the second part-body.

14. An optical arrangement, comprising:
at least one optical element as claimed in claim 1, and
a cooling device configured to flow a cooling liquid through the plurality of cooling channels.

15. An optical element for reflecting radiation, comprising:
a substrate formed from quartz glass or from a glass ceramic, and comprising a first part-body and a second part-body that are joined along a bonding face by hot bonding,
a plurality of cooling channels that run within the substrate in a region of the bonding face and are separated from one another by lands, and
a reflective coating applied to a surface of the first part-body,
wherein
a respective one of the cooling channels has a channel wall which, at at least one position adjoining a respective one of the lands, has an OH content that deviates by not more than 60 ppm by weight from an OH content at a middle of the respective land.

16. The optical element as claimed in claim 15, wherein the respective one of the cooling channels has the channel wall which, over an entire lateral wall section adjoining the respective land, has an OH content that deviates by not more than 60 ppm by weight from an OH content at the middle of the respective land.

17. The optical element as claimed in claim 15, wherein the channel wall at at least the one position facing the surface to which the reflective coating is applied has an OH content that deviates by not more than 60 ppm by weight from an OH content at the surface.

18. The optical element as claimed in claim 17, wherein the channel wall, over an entire upper wall section facing the surface, has an OH content that deviates by not more than 60 ppm by weight from an OH content at the surface.

19. The optical element as claimed in claim 15, wherein a depletion region adjoining the channel wall in which the OH content of the substrate is at least 5 ppm by weight lower than the OH content in the middle of the respective land and/or at the surface has a thickness of less than 50 μm.

20. The optical element as claimed in claim 19, wherein the channel wall of at least a respective one of the cooling channels has at least one slot-shaped depression, a depth of which is equal to at least twice a thickness of the depletion region.

21. The optical element as claimed in claim 20, wherein the channel wall has a plurality of corner regions and the at least one slot-shaped depression is formed in one of the corner regions.

* * * * *